(12) United States Patent
Chen et al.

(10) Patent No.: US 10,665,306 B1
(45) Date of Patent: May 26, 2020

(54) MEMORY DEVICE WITH DISCHARGE VOLTAGE PULSE TO REDUCE INJECTION TYPE OF PROGRAM DISTURB

(71) Applicant: SanDisk Technologies LLC, Addison, TX (US)

(72) Inventors: Hong-Yan Chen, San Jose, CA (US); Henry Chin, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/377,421

(22) Filed: Apr. 8, 2019

(51) Int. Cl.
*G11C 16/34* (2006.01)
*G11C 16/24* (2006.01)
*G11C 16/08* (2006.01)
*G11C 7/10* (2006.01)
*G11C 16/26* (2006.01)
*G11C 7/04* (2006.01)
*G11C 16/16* (2006.01)

(52) U.S. Cl.
CPC ............ *G11C 16/3427* (2013.01); *G11C 7/04* (2013.01); *G11C 7/106* (2013.01); *G11C 16/08* (2013.01); *G11C 16/16* (2013.01); *G11C 16/24* (2013.01); *G11C 16/26* (2013.01); *G11C 16/3431* (2013.01); *G11C 16/3459* (2013.01)

(58) Field of Classification Search
CPC . G11C 16/3427; G11C 16/3459; G11C 16/24; G11C 16/08; G11C 16/16; G11C 16/3431; G11C 16/26; G11C 7/04; G11C 7/106
See application file for complete search history.

(56) References Cited

U.S. PATENT DOCUMENTS

| 6,011,287 | A | 1/2000 | Itoh et al. |
| 9,368,222 | B2 | 6/2016 | Dunga et al. |
| 10,026,486 | B1 | 7/2018 | Dutta et al. |
| 2008/0112226 | A1* | 5/2008 | Mokhlesi ............ G11C 11/5628 365/185.17 |
| 2013/0250689 | A1 | 9/2013 | Lai et al. |
| 2018/0068738 | A1* | 3/2018 | Kato .................. G11C 16/0483 |

FOREIGN PATENT DOCUMENTS

EP 1714291 A2 10/2006

OTHER PUBLICATIONS

U.S. Appl. No. 16/281,572 filed Feb. 21, 2019, by Chen et al.
International Search Report & The Written Opinion of the International Searching Authority dated Apr. 2, 2020.

* cited by examiner

*Primary Examiner* — Mohammed A Bashar
(74) *Attorney, Agent, or Firm* — Vierra Magen Marcus LLP

(57) ABSTRACT

Techniques are disclosed for reducing an injection type of program disturb in a memory device. In one aspect, a discharge operation is performed at the start of a program loop. This operation discharges residue electrons from the channel region on the source side of the selected word line, WLn, to the channel region on the drain side of WLn. As a result, in a subsequent channel pre-charge operation, the residue electrons can be more easily removed from the channel. The discharge operation involves applying a voltage pulse to WLn and a first set of drain-side word lines which is adjacent to WLn. The remaining unselected word lines may be held at ground during the voltage pulse.

20 Claims, 19 Drawing Sheets

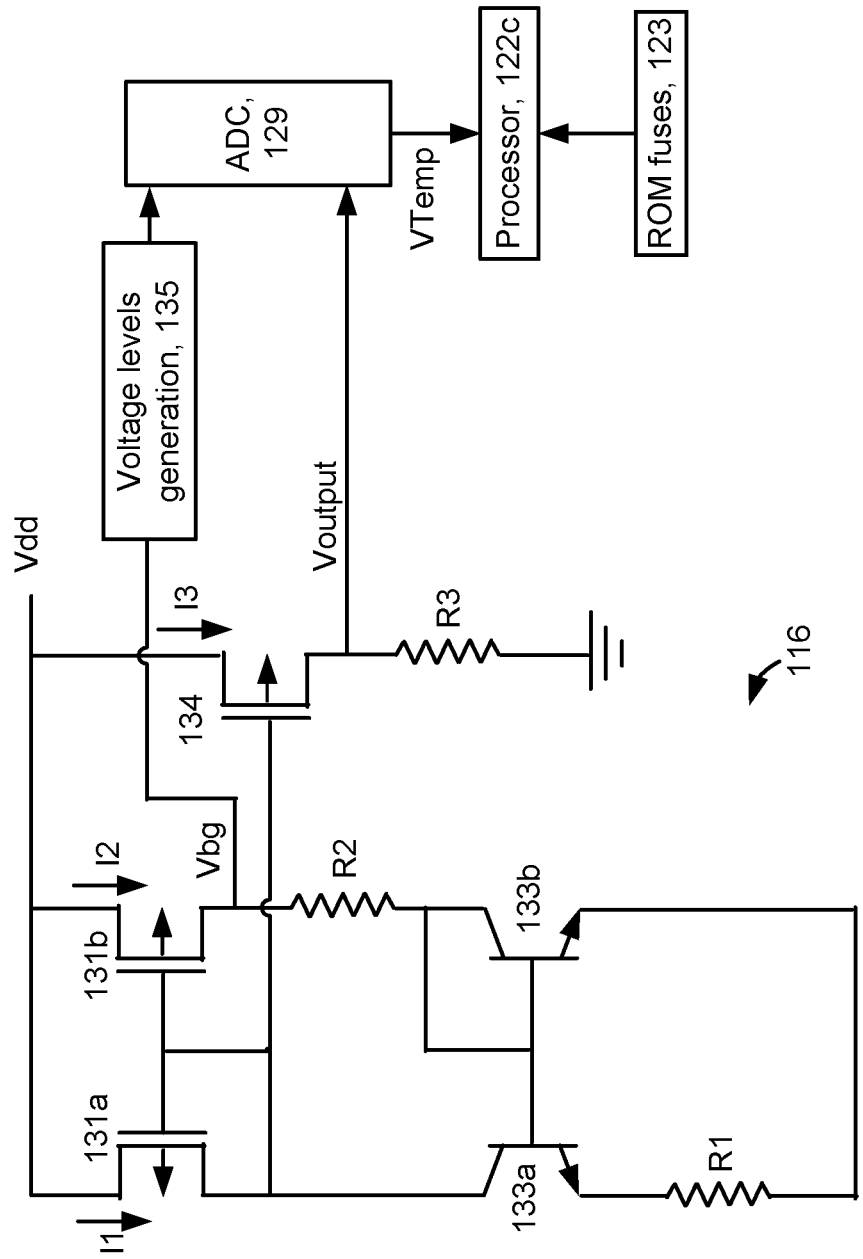

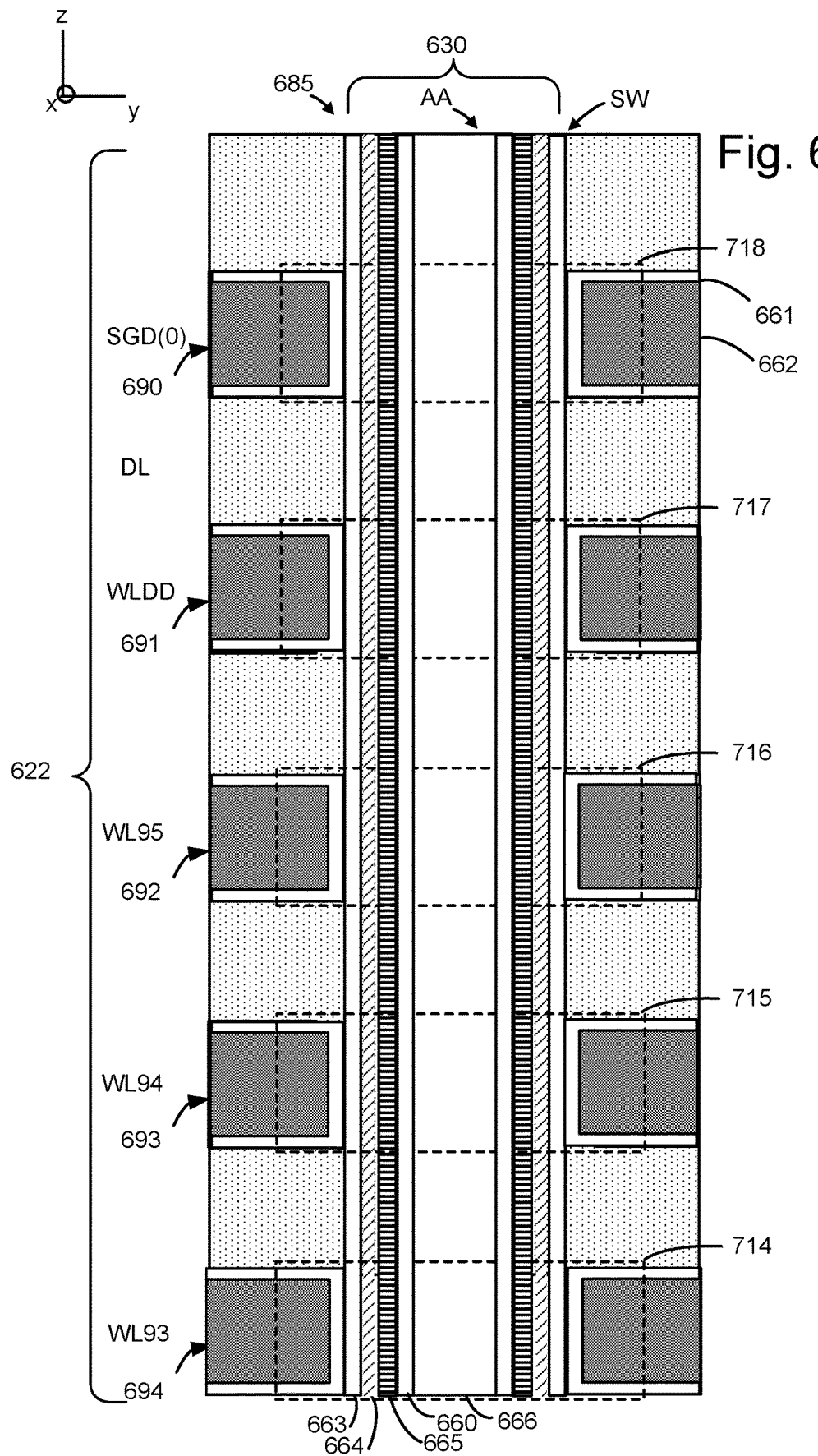

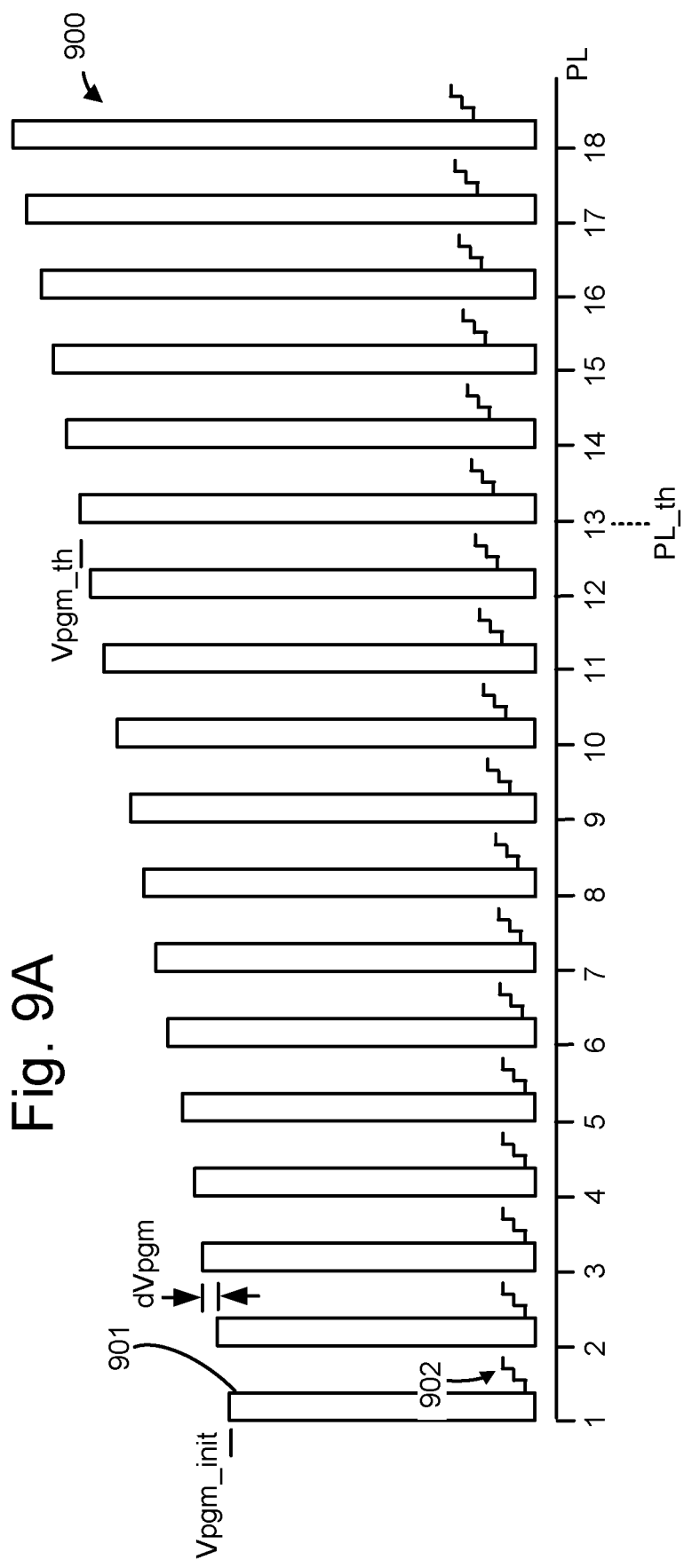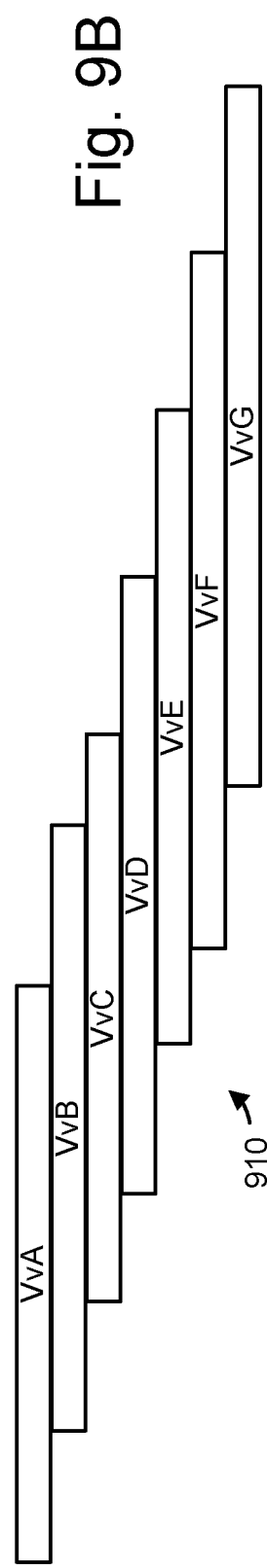

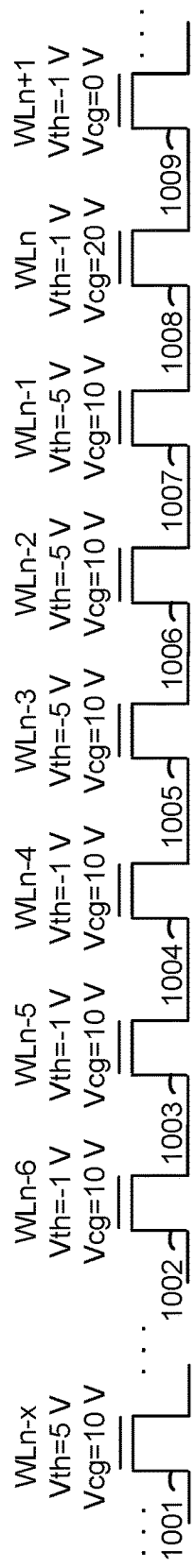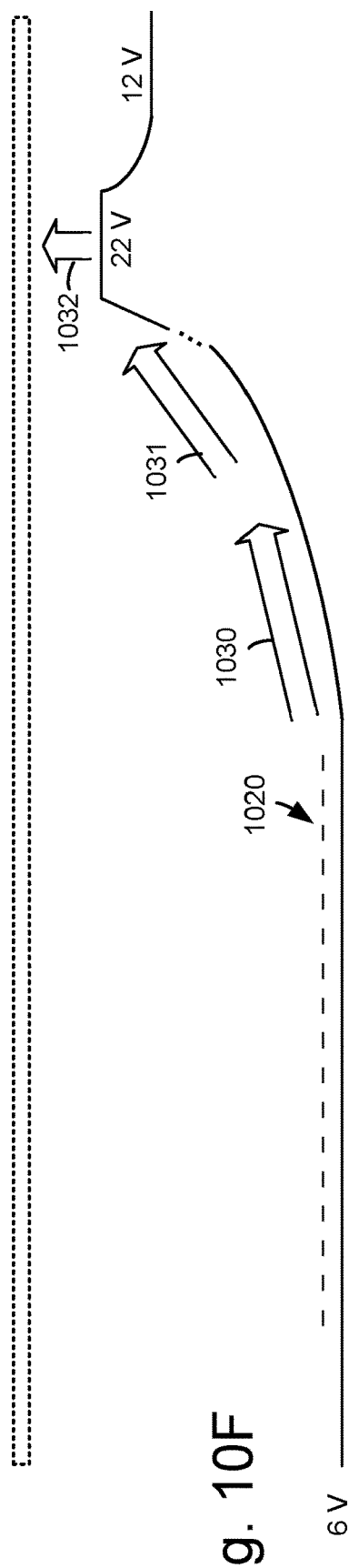
Fig. 10E
Fig. 10F

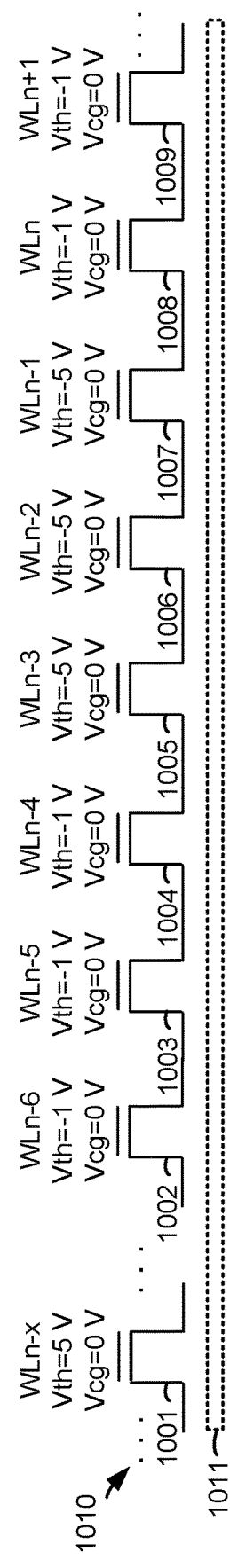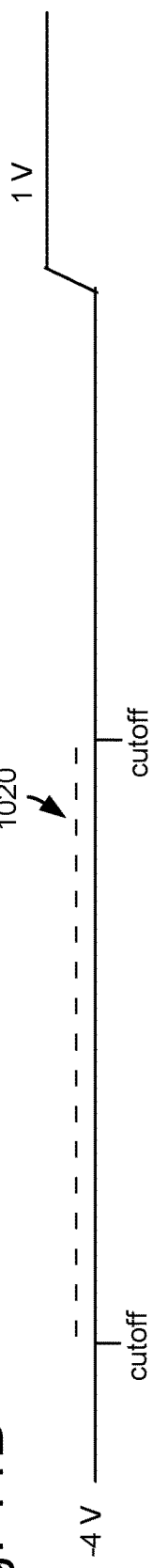

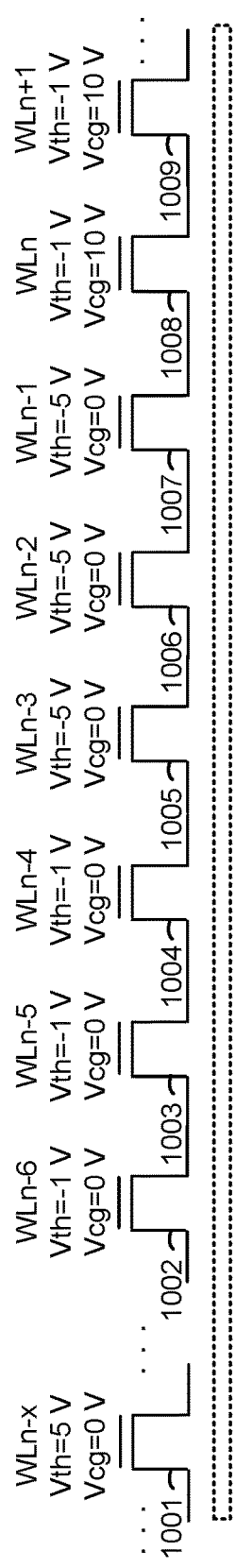
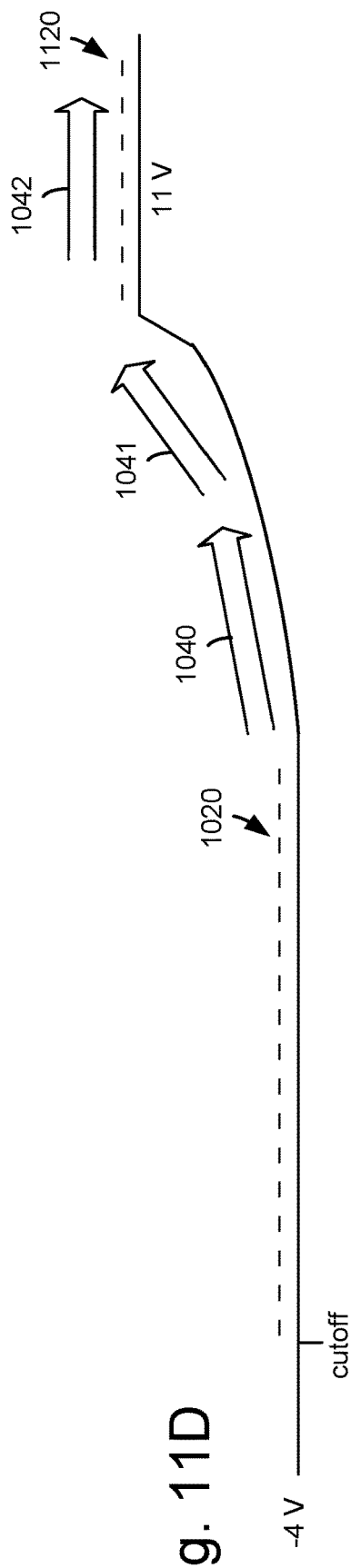
Fig. 11C
Fig. 11D

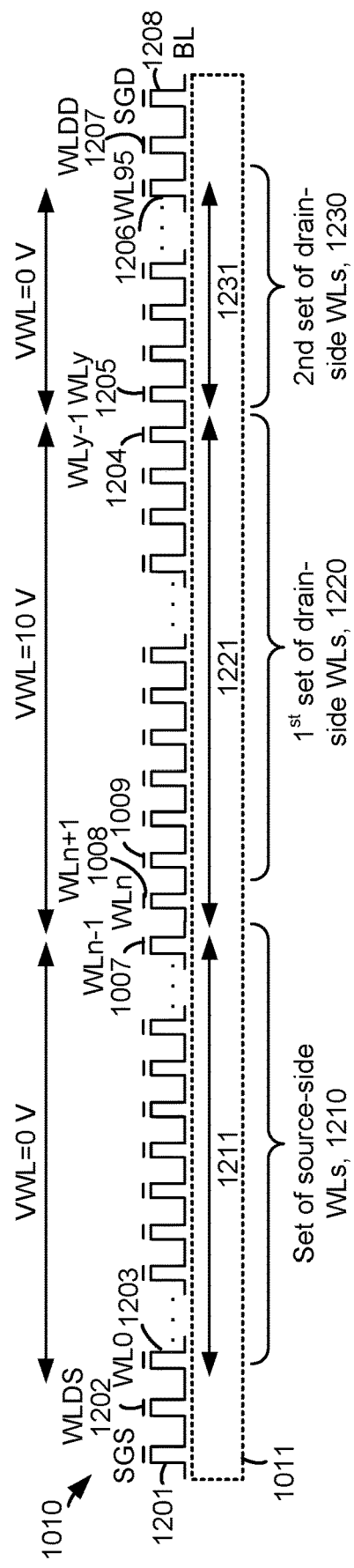
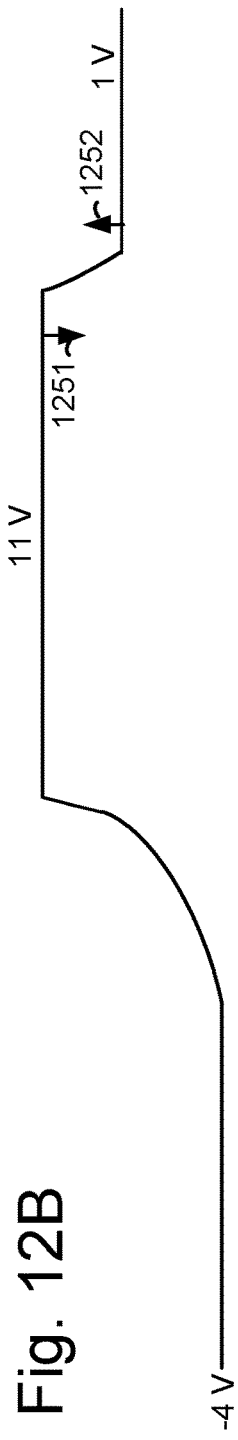
Fig. 12A
Fig. 12B

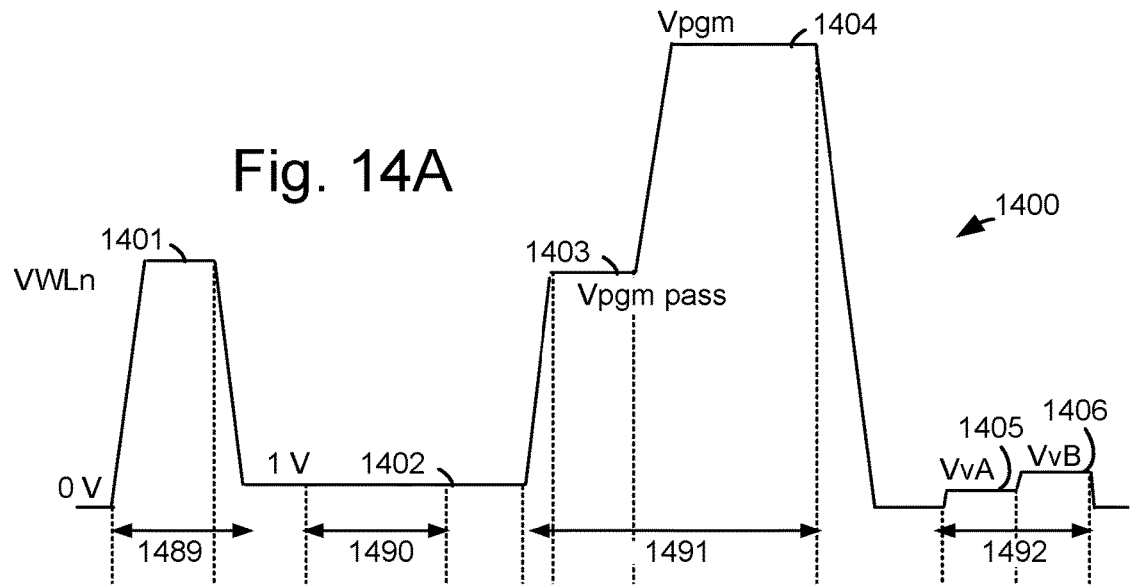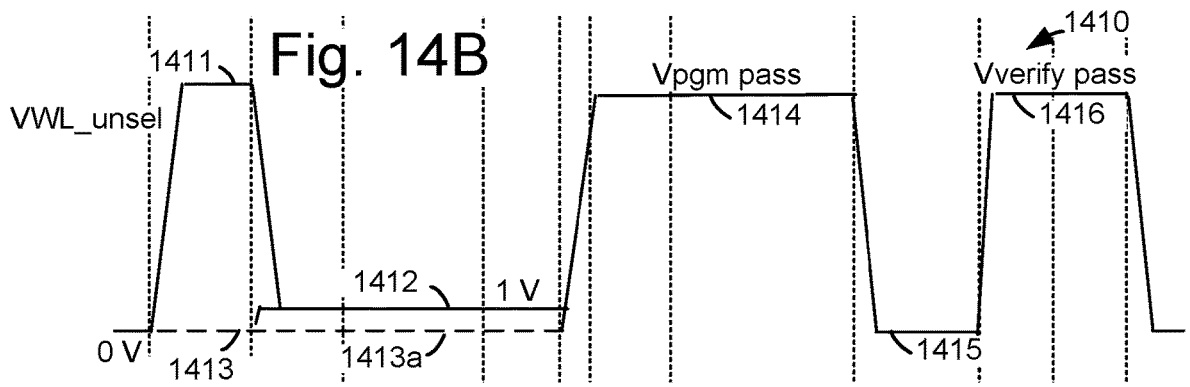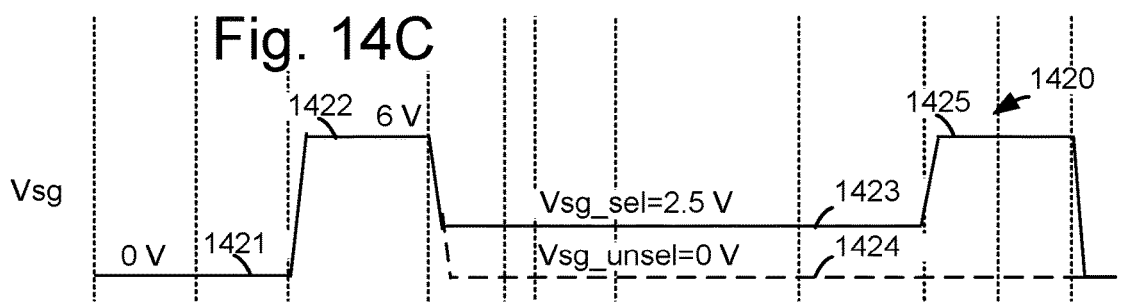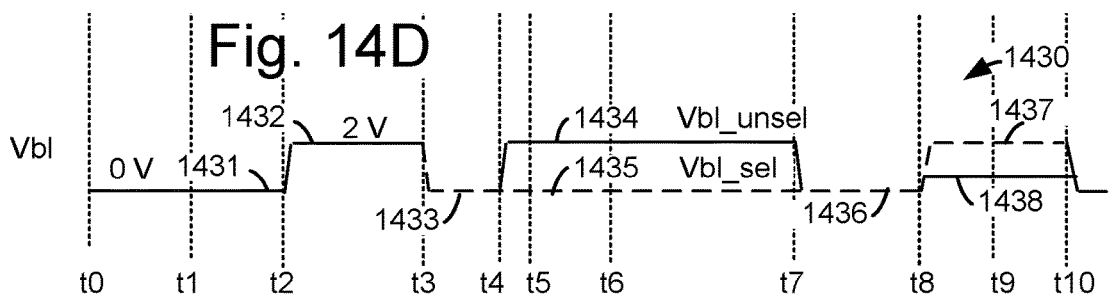

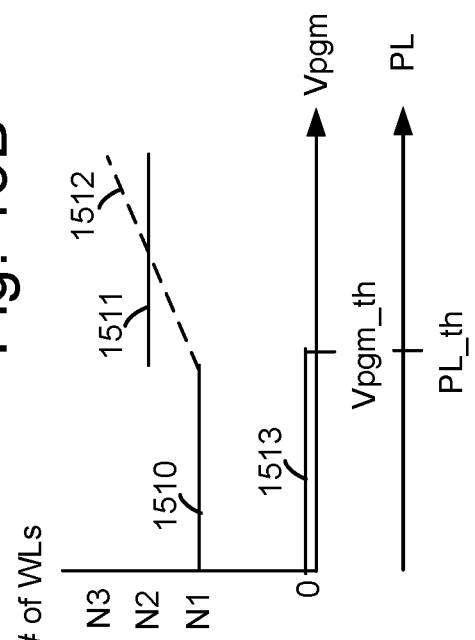
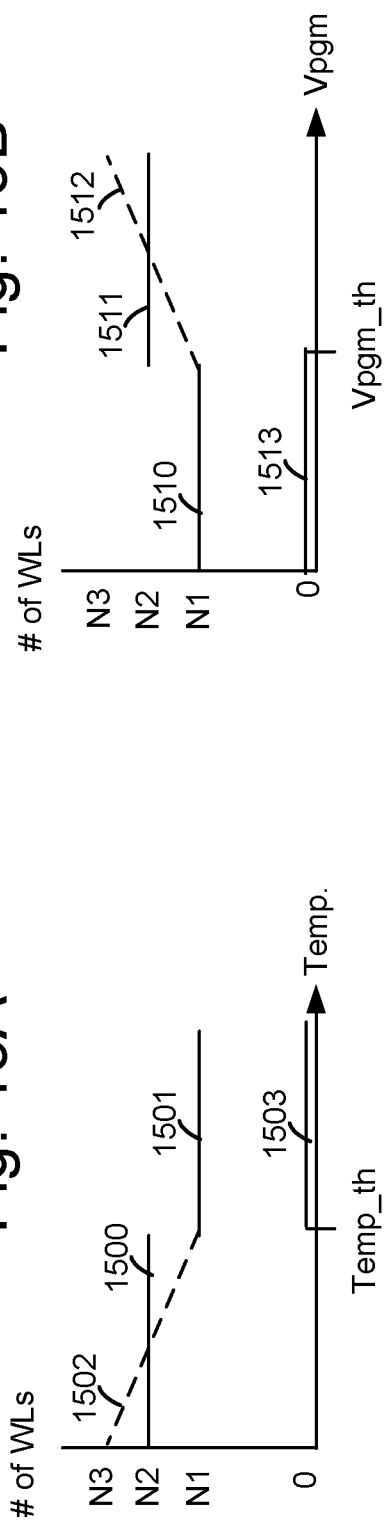
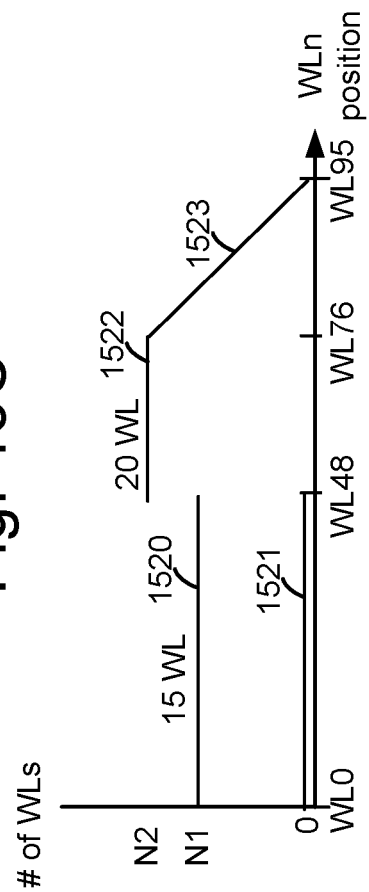
Fig. 15A
Fig. 15B
Fig. 15C

MEMORY DEVICE WITH DISCHARGE VOLTAGE PULSE TO REDUCE INJECTION TYPE OF PROGRAM DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 6B depicts a close-up view of the region 622 of the stack of FIG. 6A.

FIG. 9A depicts an example voltage signal in a program operation.

FIG. 9B depicts an example of verify voltages used in different program loops of FIG. 9A.

FIG. 10E depicts the example NAND string of FIG. 10A when the selected word line voltage is increased to Vpgm=20 V during the program phase of a program loop.

FIG. 10F depicts example channel voltages along the length of the NAND string of FIG. 10E.

FIG. 11A depicts the example NAND string 1010 and its channel 1011, showing voltages before a discharge phase of a program loop.

FIG. 11B depicts example channel voltages along the length of the NAND string of FIG. 11A.

FIG. 11C depicts the example NAND string of FIG. 11A when a discharge voltage pulse of 10 V is applied to the selected word line and a first set of drain-side word lines during the discharge phase of a program loop.

FIG. 11D depicts example channel voltages along the length of the NAND string of FIG. 11C.

FIG. 12A depicts the example NAND string 1010 and its channel 1011, showing voltages on different sets of word lines during the discharge voltage pulse, consistent with FIGS. 11C and 11D.

FIG. 12B depicts example channel voltages along the length of the NAND string of FIG. 12A, consistent with FIG. 11D.

FIG. 14A-14D depicts examples of voltage signals which can be used in a program loop of a program operation, consistent with FIG. 13A.

FIG. 14A depicts voltages applied to a selected word line.

FIG. 14B depicts voltages applied to unselected word lines.

FIG. 14C depicts voltages applied to select gate transistors.

FIG. 14D depicts voltages applied to bit lines.

FIG. 15A depicts a plot of a number of word lines in a first set of drain-side word lines which receive a discharge voltage pulse in a discharge period, versus temperature, consistent with FIGS. 12A and 13A.

FIG. 15B depicts a plot of a number of word lines in a first set of drain-side word lines which receive a discharge voltage pulse in a discharge period, versus Vpgm and program loop (PL) number, consistent with FIGS. 12A and 13A.

FIG. 15C depicts a plot of a number of word lines in a first set of drain-side word lines which receive a discharge voltage pulse in a discharge period, versus WLn position, consistent with FIGS. 12A and 13A.

DETAILED DESCRIPTION

Figure 1A:
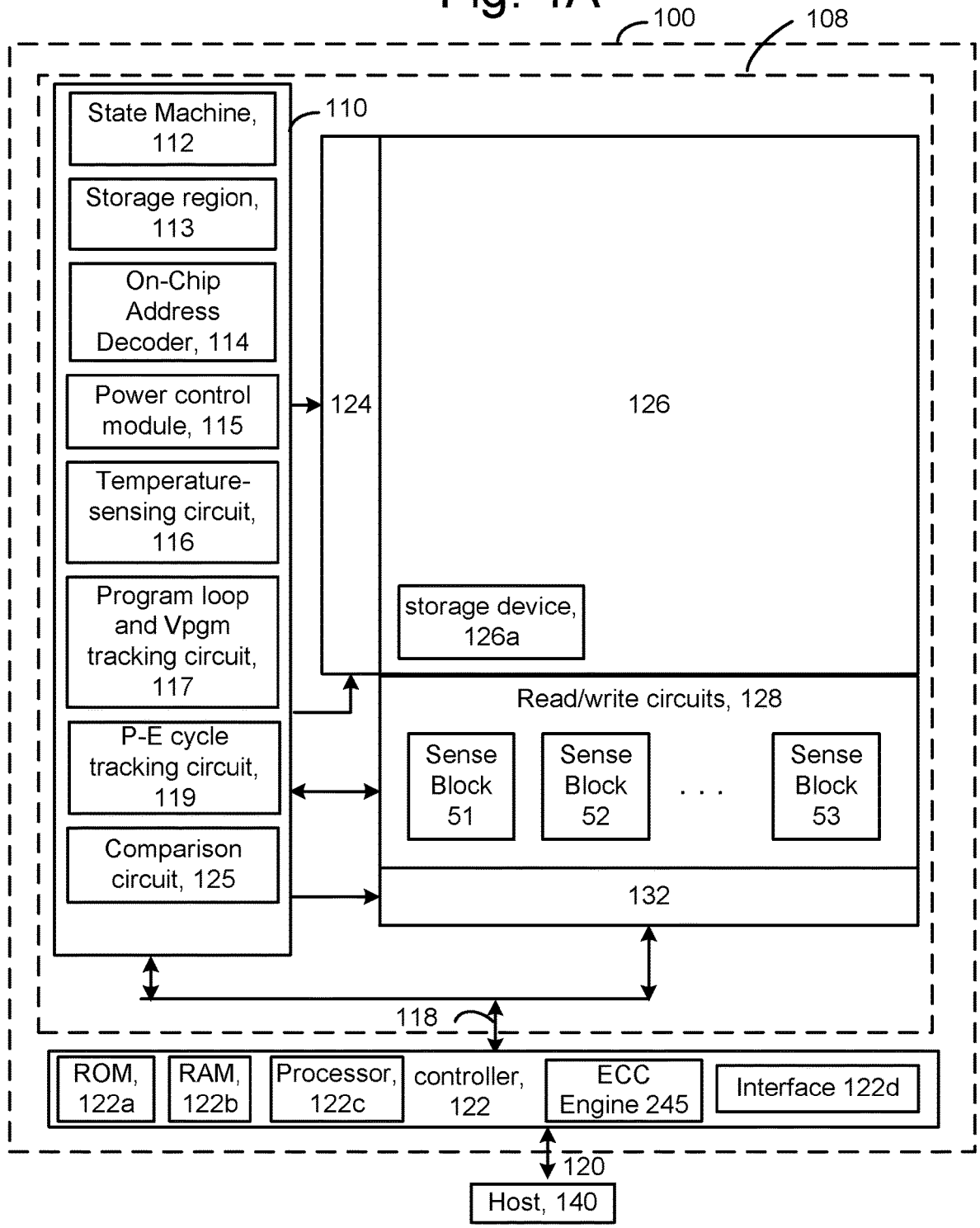
FIG. 1A is a block diagram of an example memory device.

Apparatuses and techniques are described for reducing program disturb in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn-on level which is high enough to place the unselected memory cells in a strongly conductive state, to avoid interfering with the sensing of the selected memory cells.

However, the Vth of a memory cell can change due to program disturb. Program disturb refers to inadvertent programming of memory cells. Typically, program disturb occurs for unselected memory cells connected to a selected word line during the programming of selected memory cells connected to the selected word line, due to a high gate-to-channel voltage which causes weak programming. The unselected memory cells have a lockout status, indicating that they are either assigned to the erased state and therefore should not be programmed, or they have completed programming to their assigned data state and therefore should not be further programmed. The selected memory cells have a program status, indicating that they should be programmed in the current program loop. Program disturb may be caused by a high control gate-to-channel voltage across the unselected memory cells due to the application of a high program voltage on the selected word line.

Another mechanism for program disturb, referred to as hot carrier (electron) injection type of program disturb, occurs due to the presence of voltage gradients and residue electrons in the channel of a NAND string. For example, residue electrons can remain in the channel after a sensing operation, such as a read operation or the verify test in a program operation. The residue electrons tend to be trapped in the channel on a source side of a selected word line, WLn, being programmed. The residue electrons are not able to leave the channel until the program voltage (Vpgm), e.g., 20-30 V is applied. When Vpgm is applied to WLn, a pass voltage, Vpgm pass, such as 8-10 V, is applied to the unselected word lines. Since Vpgm is much higher than Vpgm pass, the channel region on the source side of WLn can become conductive, allowing the electrons to move toward WLn and be injected into the associated memory cells, causing program disturb. See FIG. 10A-10F.

In particular, the channel region on the source side of WLn becomes conductive due to a drain-induced barrier lowering (DIBL) effect. DIBL is a short channel effect of a transistor in which the Vth decreases as the drain voltage increases. When Vpgm is applied to WLn, the voltage of the channel region adjacent to WLn also increases significantly, where this voltage is the drain voltage for the memory cells on the source side of WLn. The decrease in the Vth for the memory cells on the source side of WLn allows the associated channel region of some of the unselected memory cells to become conductive. For example, this conductivity can extend over a few word lines on the source side of WLn. The increased voltage of the channel region adjacent to WLn results in a lateral electric field in the channel which accelerates the source side residue electrons toward WLn, as depicted in FIG. 10F. The high level of Vpgm on WLn creates an electric field which draws in electrons into the charge trapping layer, causing an undesired Vth upshift.

Techniques provided herein address the above and other issues. In one aspect, a discharge operation is performed at the start of a program loop. This operation discharges residue electrons from the channel region on the source side of WLn to the channel region on the drain side of WLn. As a result, in the subsequent channel pre-charge operation, the residue electrons can be more easily removed from the channel. When Vpgm is subsequently applied, the number of source-side residue electrons is reduced, and the likelihood of program disturb is reduced since fewer electrons are available to be drawn into the charge trapping layer of the WLn memory cells.

In one approach, the discharge operation involves applying a voltage pulse to WLn and a first set of the drain-side word lines (1210 in FIG. 12B), where the first set is adjacent to WLn. The remaining unselected word lines may be held at ground during the voltage pulse. The remaining unselected word lines may include a set of source-side word lines 1210 and a second set of drain-side word lines 1230 adjacent to the first set of drain-side word lines 1220, and on the drain side of the first set. The discharge voltage pulse elevates the voltage of an associated channel region 1221 compared to a channel region 1211 on the source-side of WLn. This creates the DIBL effect mentioned above, causing electrons to move in the direction of the drain of the NAND string. For example, the source-side electrons 1020 move to become the drain-side electrons 1120 in FIG. 11D. However, since the discharge voltage pulse is lower than Vpgm, the likelihood of electrons being drawn into the charge trapping layer of WLn is relatively small. The drain-side electrons can be easily removed from the channel during the subsequent pre-charge phase when a positive bit line voltage is applied to the drain end of the NAND string.

One reason to apply the voltage pulse to just a portion of the drain-side word lines of WLn is to avoid the likelihood of a disturb due to electrons being drawn into the charge trapping layer by the voltage pulse. This likelihood is higher if all drain-side word lines receive the voltage pulse. However, the number of drain-side word lines which receive the voltage pulse should be sufficient to maintain the associated channel region 1221 at an elevated level. Specifically, with the channel region 1221 at an elevated level compared to the channel region 1231, the channel region 1231 will tend to pull down the channel region 1221, as depicted by the arrow 1251 in FIG. 12B. This pull down effect is relatively smaller when the channel region 1221 is relatively larger.

In one aspect, the number of word lines in the first set of drain-side word lines can be greater when the likelihood of disturb is greater, such as when the ambient temperature is lower, when WLn is closer to the drain-end of the NAND string and when Vpgm is greater.

In another aspect, the discharge operation can be omitted in the initial program loops of a program operation since the likelihood of disturb is relatively low. When the program loop number exceeds a threshold, e.g., when Vpgm exceeds a threshold, the discharge operation can be performed. In another aspect, the discharge operation can be omitted in a program operation when the temperature is above a threshold since the likelihood of disturb is relatively low. These approaches can reduce the time penalty of the discharge operation by using it when it is most helpful.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 115 (power control circuit), a temperature-sensing circuit 116, a program loop and Vpgm tracking circuit 117, a P-E cycle tracking circuit 119, and a comparison circuit 125. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation, for example, for use by the comparison circuit. The program loop and Vpgm tracking circuit 117 can detect when the current program loop number and Vpgm. The P-E cycle tracking circuit 119 can track a number of P-E cycles which are accumulated over time by a block or other set of memory cells.

The comparison circuit 125 can store threshold values of temperature (Temp_th), program voltage (Vpgm_th), program loop number (PL_th), P-E cycles (P-E_th) and word line position (WLn_th), and compare these threshold values to the current temperature, program voltage, program loop number, P-E cycles and word line position, respectively, to determine whether a discharge operation should be performed in a current program loop and/or to determine characteristics of the discharge operation such as the number of word lines which will receive a discharge voltage pulse. The comparison circuit can receive the current temperature from the circuit 116, the current program voltage and program loop number from the circuit 117, the current number of P-E cycles from the circuit 119 and the current word line position from the state machine 112.

The comparison circuit can be used to implement the techniques of FIG. 15A-15C.

See FIG. 1B for an example implementation of the temperature-sensing circuit. The temperature-sensing circuit, program loop and Vpgm tracking circuit, P-E cycle tracking circuit, and comparison circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program loop and Vpgm tracking circuit 117, P-E cycle tracking circuit 119, comparison circuit 125, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122*c*. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131*b* and the voltage drop across the resistor R2. The bipolar transistor 133*a* has a larger area (by a factor N) than the transistor 133*b*. The PMOS transistors 131*a* and 131*b* are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131*a* and 131*b* and the current through the transistor 134 mirrors the current through the transistors 131*a* and 131*b*.

Figure 2:
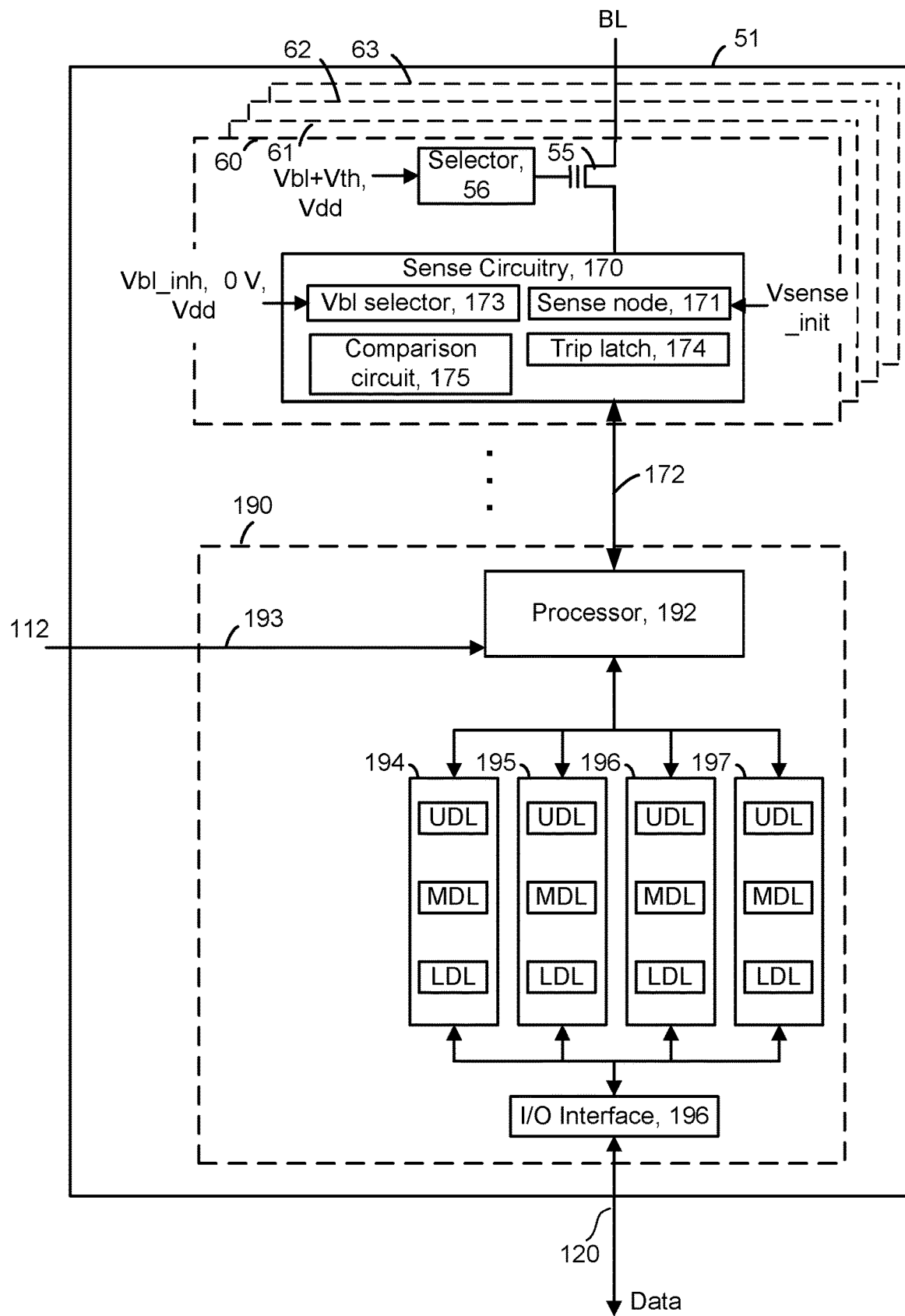
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line. An example Vbl during sensing is 0.5 V.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
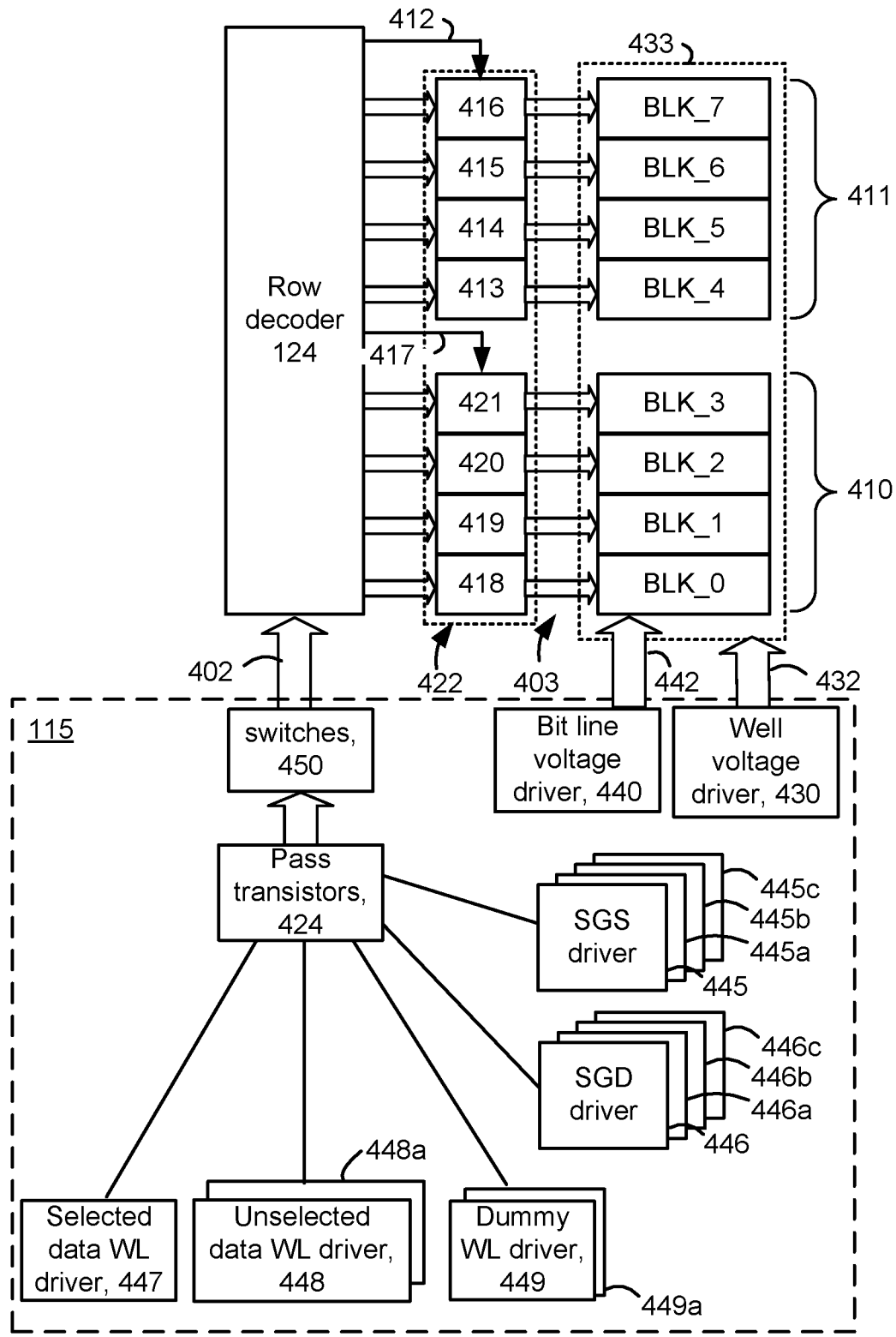
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
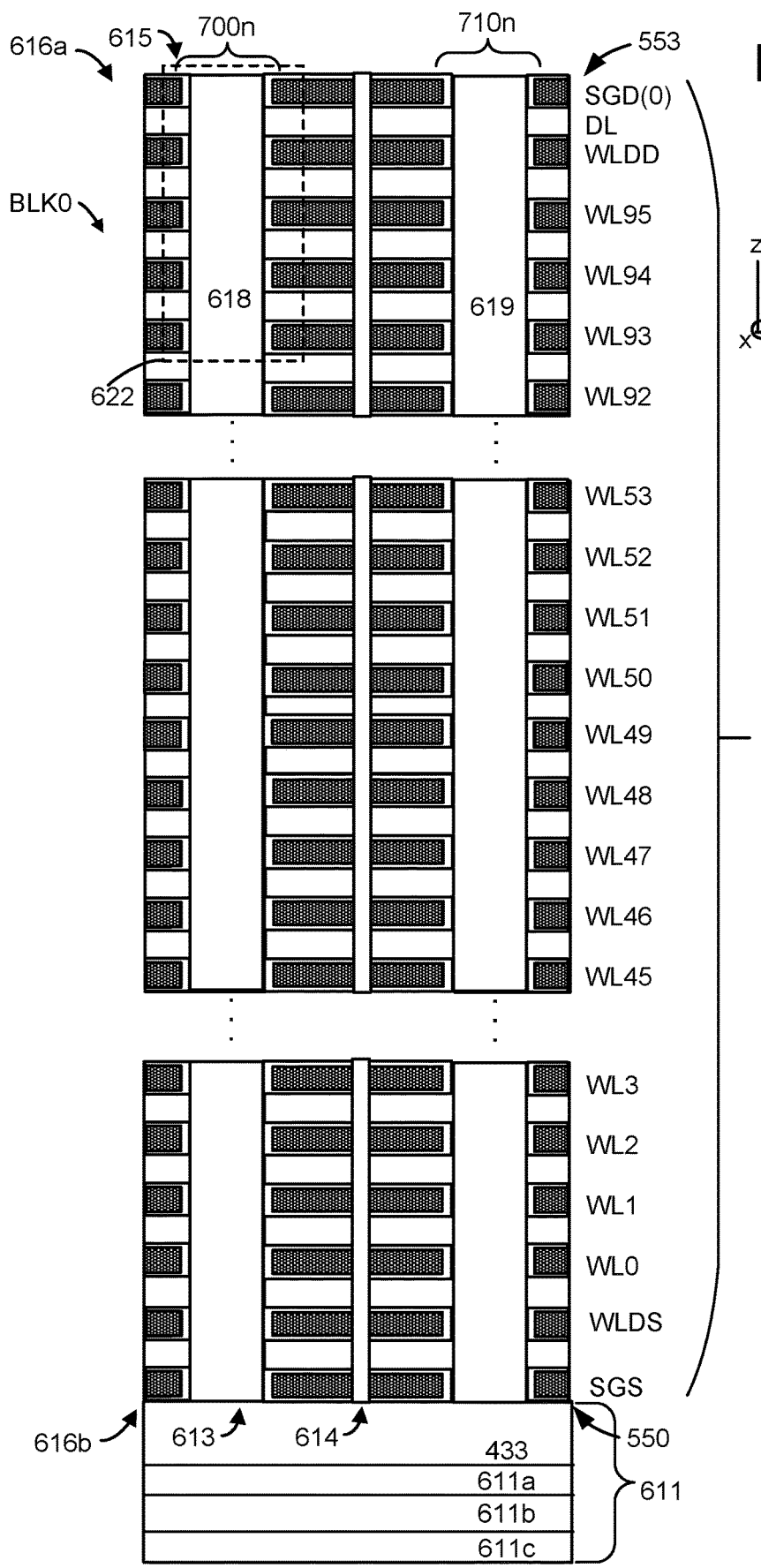
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448 and 448a for unselected data word lines, and dummy word line drivers 449 and 449a which provide voltages on dummy word lines WLDD and WLDS, respectively, in FIG. 6A. For example, during a discharge operation as described herein, the driver 448 may be used to apply a voltage pulse to WLn and a first set of drain-side word lines while the driver 448a is used to apply a ground voltage to the remaining word lines.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIG. 7. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
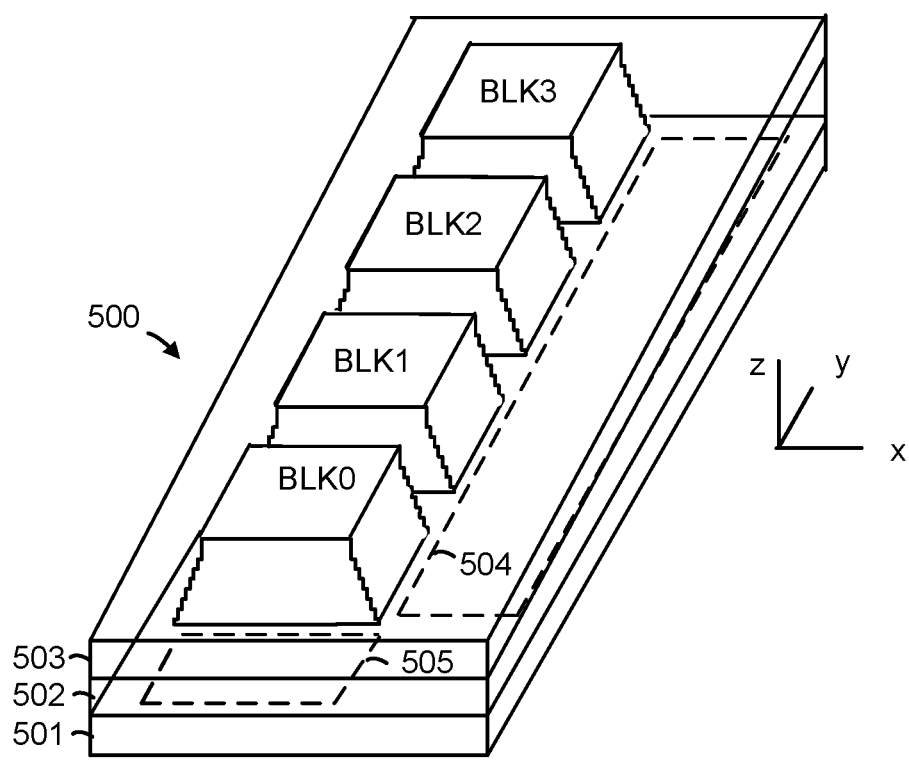
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
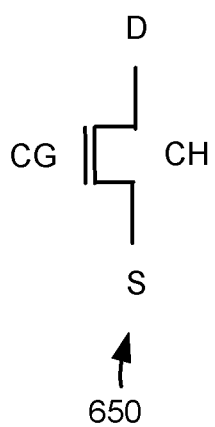
FIG. 5 depicts an example transistor 650.

FIG. 5 depicts an example transistor 650. The transistor comprises a control gate CG, a drain D, a source S and a channel CH and may represent a memory cell or a select gate transistor, for example.

FIG. 6A depicts an example cross-sectional view of a portion of BLK0 of FIG. 4, including NAND strings 700n and 710n. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. WL0-WL95 are data word lines connected to data memory cells, which are eligible to store user data. As an example only, the stack includes ninety-six data word lines. DL is an example dielectric layer.

A top 553 and bottom 550 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

FIG. 6B depicts a close-up view of the region 622 of the stack of FIG. 6A. Memory cells are formed at the different levels of the stack at the intersection of a word line layer and a memory hole. An SGD transistor 718 connected to SGD (0), a dummy memory cell 717 connected to WLDD and data memory cells 714-716 connected to WL93-WL95, respectively, are depicted.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Figure 7:
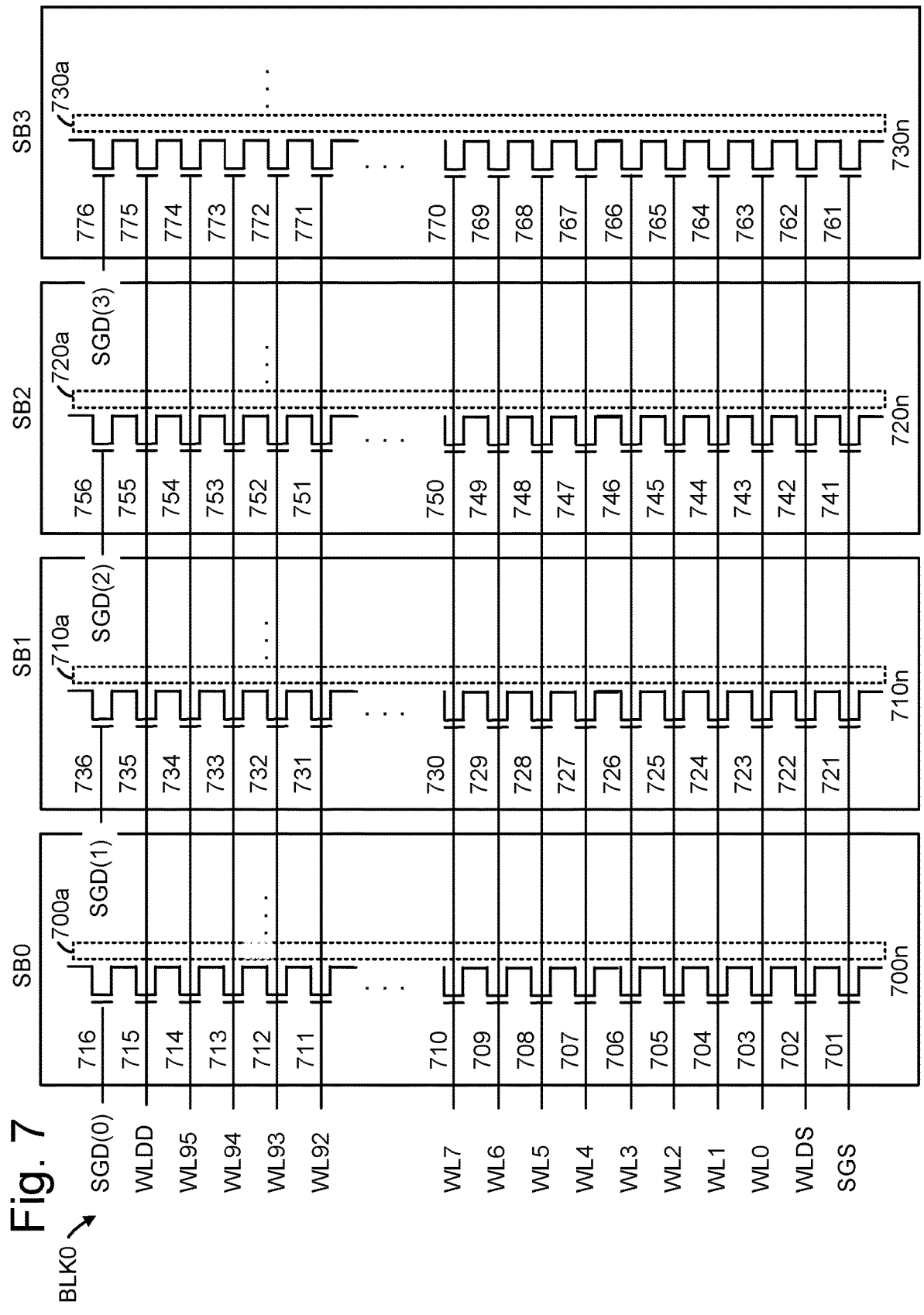
FIG. 7 depicts an example view of NAND strings in a block BLK0 which is consistent with FIGS. 4 and 6A.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. Another option programs all of the memory cells in one sub-block, one word line at a time, before programming the memory cells of the next sub-block. For example, this can involve programming WL0, then WL1 and so forth in SB0, followed by programming WL0, then WL1 and so forth in SB1, and so forth. The word line programming order may start at WL0, the source-end word line and end at WL95, the drain-end word line, for example.

The NAND strings 700n, 710n, 720n and 730n have channels 700a, 710a, 720a and 730a, respectively.

Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 8:
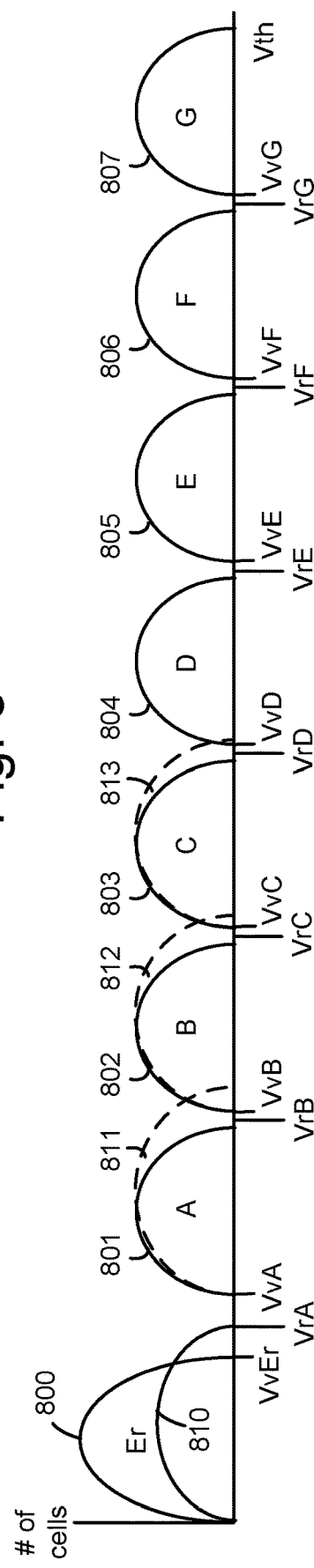
FIG. 8 depicts example Vth distributions of a set of memory cells with and without program disturb.

FIG. 8 depicts example Vth distributions of a set of memory cells with and without program disturb. The vertical axis depicts a number of memory cells on a logarithmic scale, and the horizontal axis depicts a Vth of the memory cells on a linear scale. In one approach, at a start of a program operation, the memory cells are all initially in the erased state, as represented by the Vth distribution 800. After the program operation is successfully completed, the memory cells assigned to the A-G states are represented by the Vth distributions 801-807.

The memory cells which are programmed to the A-G states using verify voltages of VvA-VvG, respectively, are represented by the Vth distributions 801-807, respectively. These Vth distributions are obtained just after completion of the program operation, and assume no program disturb has occurred. The verify voltages are used in the program-verify tests of the memory cells. Read voltages VrA-VrG can be used for reading the states of the memory cells in a read operation. These verify voltages and read voltages are examples of control gate read levels of the selected word line voltage.

However, due to program disturb, the Vth of the data memory cells can shift higher, as represented by the Vth distributions 810, 811, 812 and 813 for the Er, A, B and C data states, respectively. The amount of program disturb (amount of Vth upshift at the upper tail of the Vth distribution) is relatively large for the relatively low data states. The relatively high data states of D-G in this example are assumed to have no program disturb, as a simplification. The techniques described herein for reducing program disturb can reduce the amount of Vth upshift.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight-state example. The number of data states could be higher or low than eight data states.

FIG. 9A depicts an example voltage signal in a program operation. The voltage signal can be used in a single pass program operation or in one pass of a multi-pass program operation. The program operation can be used to program memory cells to threshold voltages such as depicted in FIG. 8. The horizontal axis denotes a program loop (PL) number, ranging from 1-18, and the vertical axis denotes voltage. During a program operation, program loops are performed for a selected word line in a selected sub-block. A program loop comprises a program portion in which a program voltage or pulse is applied to the selected word line followed by a verify portion in which a verify signal or pulse is applied to the selected word line while one or more verify tests, referred to as program-verify tests, are performed for the associated memory cells. Other than the erased state, each assigned state has a verify voltage which is used in the verify test for the state in a program operation.

The voltage signal 900 includes a series of program voltages, including an initial program voltage 901, which are applied to a word line selected for programming. In this example, the voltage signal includes program voltages which increase stepwise in amplitude in one or more program loops of a programming pass using a fixed or varying step size. This is referred to as incremental step pulse programming, where the program voltage (Vpgm) starts at an initial voltage, Vpgm_init, and increases in a step in each successive program loop, for instance, until the program operation is completed. A fixed step size of dVpgm is depicted. A successful completion occurs when the threshold voltages of the selected memory cells reach the verify voltages of the assigned data states. A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operation proceeds, such as depicted in FIG. 9B. The example verify signals depict three verify voltages as a simplification.

All memory cells may initially be in the erased state at the beginning of the program operation, for instance. After the program operation is completed, a Vth distribution similar to that in FIG. 8 is achieved, and the data can be read from the memory cells using read voltages which are between the Vth distributions. At the same time, a read pass voltage, Vread pass (e.g., 8-10 V), also referred to as pass voltage or turn-on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. In each three-bit sequence, the UP bit is followed by the MP bit and then the LP bit. The data of the lower, middle and upper pages can be determined by reading the memory cells using read voltages of VrA and VrE; VrB, VrD and VrF; and VrC and VrG, respectively.

An example threshold Vpgm, Vpgm_th, consistent with FIG. 15B, is depicted, along with a corresponding example threshold program loop number, PL_th.

FIG. 9B depicts an example of verify voltages used in different program loops of FIG. 9A. The horizontal bars are time-aligned with the program loop axis of FIG. 9A. The set of verify voltages 910 includes VvA, VvB, VvC, VvD, VvE, VvF and VvG used in program loops 1-7, 2-9, 4-10, 5-12, 7-14, 8-16 and 10-18, respectively.

Figure 10A:
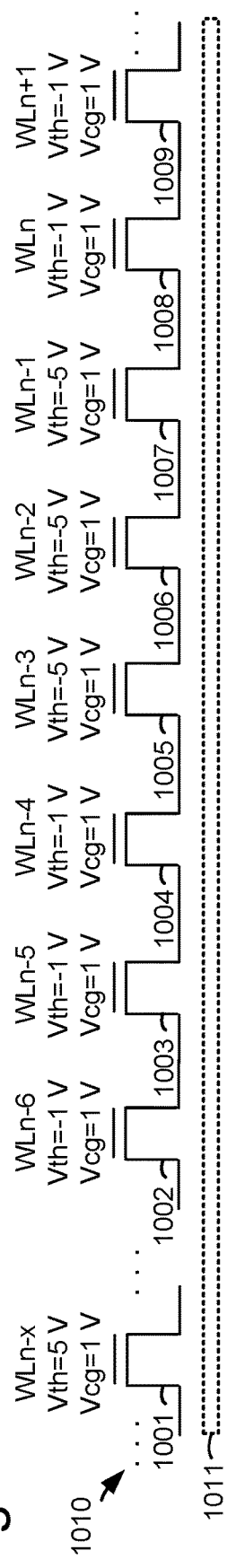
FIG. 10A depicts an example NAND string 1010 and its channel 1011, showing voltages during a pre-charge phase of a program loop.

FIG. 10A depicts an example NAND string 1010 and its channel 1011, showing voltages during a pre-charge phase 1490 (FIG. 14A) of a program loop. For generality, the NAND string includes memory cells 1001-1009 which are connected to word lines WLn-x and WLn-6 to WLn+1, respectively. WLn-x is x word lines away from WLn on the source-side of WLn. In this example, the memory cells connected to WL0 through WLn-1 have been programmed at the time WLn is being programmed. The data states to which the memory cells are programmed is random but some data patterns are more likely to cause program disturb. For example, the memory cell 1001 is programmed to a high state with Vth=5 V (such as the G state in FIG. 8), the memory cells from WLn-6 through WLn-4 are in the erased state with Vth=-1 V, the memory cells from WLn-3 through WLn-1 are in the high state with Vth=5 V and the memory cells of WLn and WLn+1 are in the erased state. The memory cells of WLn may be in the erased state if they have been assigned to a higher state but programming has just started, or if they have been assigned to the erased state, for instance. The memory cells of WLn+1 are in the erased state since they have not yet been programmed, in one approach. A control gate voltage Vcg=1 V is applied to the word lines.

Figure 10B:
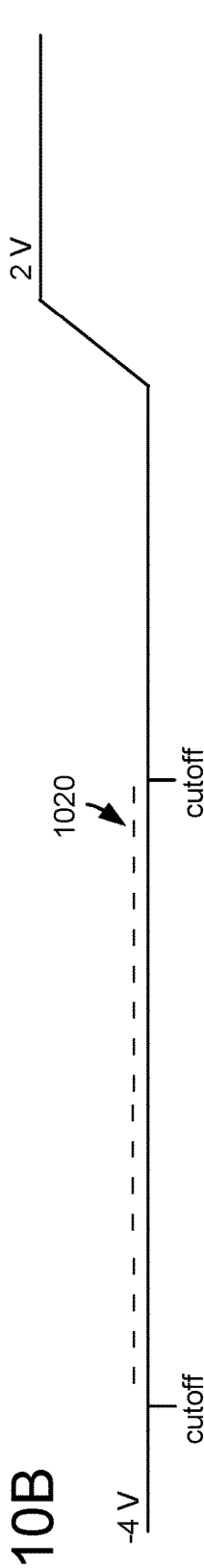
FIG. 10B depicts example channel voltages along the length of the NAND string of FIG. 10A.

FIG. 10B depicts example channel voltages along the length of the NAND string of FIG. 10A. The channel regions adjacent to the memory cells 1001 and 1005 will be about -4 V (1-5 V) so that the channel is cutoff as depicted. Residue electrons 1020 are trapped in a portion of the channel between memory cells 1001 and 1005. Generally, residue electrons are trapped in the source-side channel after a sensing operation such as a read operation or a verify operation. The channel region adjacent to the memory cells 1008 and 1009 is about 2 V assuming Vbl=2 V (FIG. 14D) is applied at the drain end of the NAND string.

Figure 10C:
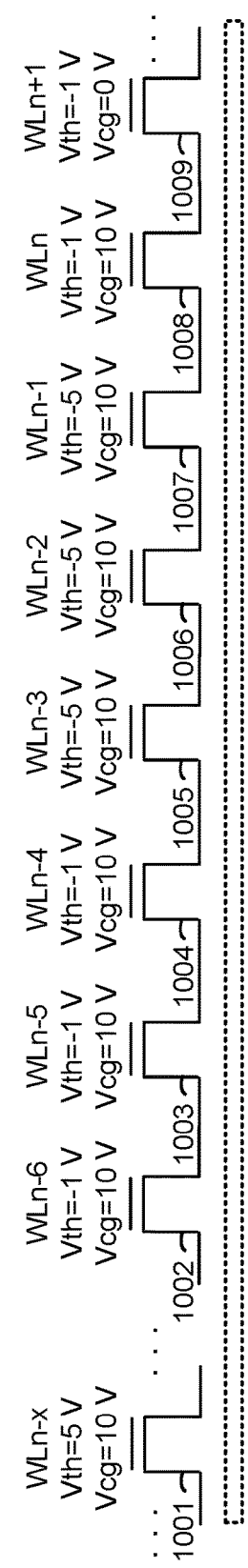
FIG. 10C depicts the example NAND string of FIG. 10A when word line voltages are increased to Vpgm pass=10 V during the program phase of a program loop.

FIG. 10C depicts the example NAND string of FIG. 10A when word line voltages are increased to Vpgm pass during the program phase of a program loop. Each of the word line voltages, including the selected and unselected word lines, is increased from 0 V to 10 V, for example.

Figure 10D:
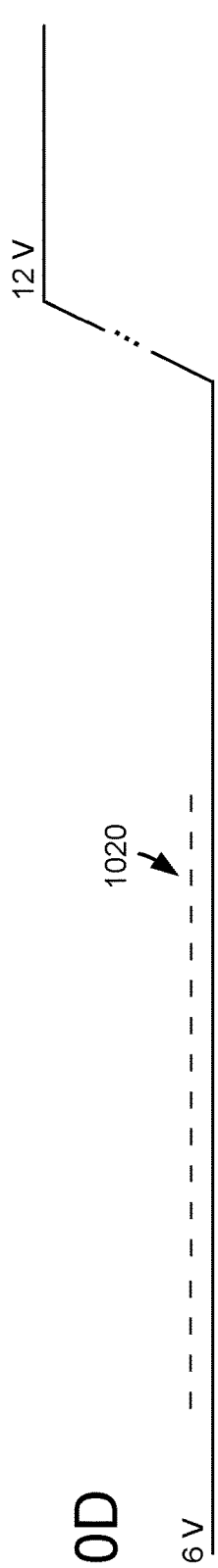
FIG. 10D depicts example channel voltages along the length of the NAND string of FIG. 10C.

FIG. 10D depicts example channel voltages along the length of the NAND string of FIG. 10C. The channel regions adjacent to the memory cells 1000-1007 will increase to about 6 V (-4+10 V) since the channel is coupled up by about the same amount as the increase of the word line voltage. The residue electrons 1020 are no longer trapped but are not yet strongly attracted toward WLn because the DIBL effect is not strong. The channel region adjacent to the memory cells 1008 and 1009 increases to 12 V (2+10 V).

FIG. 10E depicts the example NAND string of FIG. 10A when the selected word line voltage is increased to Vpgm during the program phase 1491 (FIG. 14A) of a program loop. The voltage of WLn is increased from 10 V (Vpgm pass) to 20 V (Vpgm), for example. The channel region adjacent to the memory cell 1008 increases to 22 V (12+10 V). The channel region adjacent to the memory cell 1009 remains at 12 V. The WLn voltage is high enough to cause the channel regions adjacent to the memory cells 1005-1007 to become conductive due to a DIBL effect, as mentioned at the outset. As a result, the residue electrons 1020 can move toward the higher voltage adjacent to WLn (as indicated by the arrows 1030 and 1031) and can be injected into the charge trapping layers of the memory cells connected to WLn (as indicated by the arrow 1032). This is an example of injection type of program disturb.

FIG. 10F depicts example channel voltages along the length of the NAND string of FIG. 10E. As mentioned, the channel region adjacent to the memory cell 1008 increases to 22 V. As Vpgm increases on WLn in the successive program loops of a program operation consistent with FIG. 9A, the voltage of the channel region adjacent to WLn also increases, so that the DIBL effect and the movement of the residue electrons toward WLn also increases.

When a discharge operation is performed before the pre-charge operation as described herein, the number of source-side residue electrons is reduced so that fewer electrons are available to move toward WLn and potentially cause a disturb.

FIG. 11A depicts the example NAND string 1010 and its channel 1011, showing voltages before a discharge phase of a program loop. In this example, Vcg=0 V is applied to each of the word lines. The source-side channel region of WLn will be cutoff at memory cells 1001 and 1005, and the source-side channel voltage will be -4 V, as in FIG. 10A. The channel region of WLn and WLn+1 will be at 1 V (0-1 V) since the voltage of this region is floating rather than being driven by Vbl=2 V as in FIG. 10A. The channel voltage is floating since a turn-off voltage is applied to the SGD transistor so that it is in a non-conductive state. In contrast, in FIG. 10A, a turn-on voltage is applied to the SGD transistor so that it is in a conductive state.

FIG. 11B depicts example channel voltages along the length of the NAND string of FIG. 11A. The source-side channel voltage is -4 V and the drain-side channel voltage is 1 V, as discussed.

FIG. 11C depicts the example NAND string of FIG. 11A when a discharge voltage pulse of 10 V is applied to the selected word line and a first set of drain-side word lines during the discharge phase of a program loop. See also FIGS. 12A and 12B for a view of the full NAND string. When the voltage pulse is applied, the channel region associated with WLn and WLn+1 is increased to 11 V (1+10 V). The voltage pulse is not applied to the source-side word lines so that the source-side channel region remains at -4 V. The channel gradient due to the 15 V difference between 11 V and -4 V causes the channel regions adjacent to the memory cells 1005-1007 to become conductive due to a DIBL effect similar to that in FIGS. 10E and 10F. As a result, the residue electrons 1020 can move toward the higher voltage adjacent to WLn and WLn+1 (as indicated by the arrows 1040 and 1041). However, since the voltage pulse applied to WLn is less than Vpgm, there is not a large likelihood that the electrons are injected into the charge trapping layers of the memory cells connected to WLn. Instead, the electrons can move into a channel region associated with the first set of drain-side word lines which receive the voltage pulse (as indicated by the arrow 1042).

In the subsequent pre-charge operation, the electrons in the drain-side channel can be easily removed from the channel when the positive Vbl is applied. When the word line voltages are subsequently ramped up to Vpgm pass in the program phase, the channel boosting is improved due to the absence of the residue electrons. This improved channel boosting reduces the gate-to-channel voltage and therefore reduces the program disturb. Additionally, the injection type of disturb of WLn is reduced.

FIG. 11D depicts example channel voltages along the length of the NAND string of FIG. 11C. The source-side channel voltage is −4 V and the drain-side channel voltage is 11 V, as discussed.

FIG. 12A depicts the example NAND string 1010 and its channel 1011, showing voltages on different sets of word lines during the discharge voltage pulse, consistent with FIGS. 11C and 11D. The NAND string 1010 and channel 1011 of FIG. 10A-11D are repeated with additional details. The NAND string includes an SGS transistor 1201 connected to an SGS control line, a source-side dummy word line transistor 1202 connected to WLDS, an SGD transistor 1208 connected to an SGD control line, and a drain-side dummy word line transistor 1207 connected to WLDD. The channel includes a channel region 1211 associated with a set of source-side word lines 1210 (e.g., WL0-WLn−1) and memory cells 1203, . . . , 1007, a channel region 1221 associated with WLn and a first set of drain-side word lines 1220 (e.g., WLn+1-WLy−1) and memory cells 1008, 1009, . . . , 1204, and a channel region 1231 associated with a second set of drain-side word lines 1230 (e.g., WLy-WL95) and memory cells 1205, . . . , 1206.

A word line voltage VWL=0 V is applied to the set of source-side word lines 1210 and the second set of drain-side word lines 1230, and VWL=10 V is applied to the first set of drain-side word lines 1220 in this example.

FIG. 12B depicts example channel voltages along the length of the NAND string of FIG. 12A, consistent with FIG. 11D. The channel regions 1211, 1221 and 1231 are at −4 V, 11 V and 1 V, respectively, for example. The downward arrow 1251 depicts the tendency of the voltage in the channel region 1221 to be pulled down by the voltage in the channel region 1231, and the upward arrow 1252 depicts the tendency of the voltage in the channel region 1231 to be pulled up by the voltage in the channel region 1221. A channel region has a greater ability to maintain its voltage when its size/length and capacitance is greater. Thus, the channel region 1221 can maintain its voltage for a longer period of time when the first set of drain-side word lines 1220 has more word lines.

There is a tradeoff between the desire to apply the voltage pulse to all of the drain-side word lines to provide an elevated voltage channel region for the source-side electrons to move into, where the elevated voltage is maintained for a sufficient period of time and is not pulled down, and the desire to avoid an increased likelihood of disturb when the voltage pulse is applied to many word lines.

There is also a tradeoff between the desire to apply a sufficiently high voltage pulse to be sure that a sufficient amount of DIBL is created to discharge the source-side electrons to the drain-side channel region, and the desire to avoid an excessively high voltage pulse which would increase the likelihood of disturbs. A voltage pulse which is the same or similar as a pass voltage, e.g., Vpgm pass, Vread pass or Vverify pass, may be appropriate. A pass voltage is typically provided at a level which provides a transistor in a strongly conductive state without causing an excessive risk of program disturb. The level of the discharge voltage pulse may exceed the level of the voltage of the set of source-side word lines by at least 5-8 V or 5-10 V, for example.

In one approach, the number of word lines in the first set of drain-side word lines, which is the number of word lines which receive the voltage pulse in the discharge operation, is at least 10-20% of the total number of data word lines. The number may be less than 30-40% of the total number of data word lines. For example, with 96 word lines as in this example, the voltage pulse may be applied to at least 10-19 but less than 29-39 word lines. The first drain-side set of word lines 1220 may comprise at least 10% of the unselected word lines.

In an example implementation, an apparatus comprises: a set of memory cells arranged in NAND strings, each NAND string has a drain-end and a source end, and a select gate transistor at the drain-end; bit lines connected to the drain-end of each NAND string; a selected word line and unselected word lines connected to the set of memory cells, the unselected word lines comprising a first drain-side set of word lines 1220 adjacent to the selected word line WLn on a drain-side of the selected word line, and a set of source-side word lines 1210 adjacent to the selected word line on a source-side of the selected word line; and a control circuit. The control circuit, to perform a selected program loop for the selected word line in a plurality of program loops of a program operation, is configured to: in a discharge period, applying a voltage pulse to the selected word line and the first drain-side set of word lines while holding a voltage of the set of source-side word lines at a level, e.g., 0 V, which is lower than a level, e.g., 10 V, of the voltage pulse and while applying a turn-off voltage, e.g., 0 V, to the select gate transistors; in a pre-charge period which is after the discharge period, applying a turn-on voltage, e.g., 6 V, to the select gate transistors and a positive voltage, e.g., 2 V to the bit lines; and in a program period which is after the pre-charge period, applying a program pulse Vpgm to the selected word line while applying a pass voltage Vpgm pass to the unselected word lines.

In one aspect, the unselected word lines comprises a second drain-side set of word lines 1230 adjacent to the first drain-side set of word lines 1220; and the control circuit is configured to, in the discharge period, hold a voltage of the second drain-side set of word lines at a level, e.g., 0 V, which is lower than the level of the voltage pulse.

The voltage of the second drain-side set of word lines may be equal to the voltage of the set of source-side word lines in the discharge period.

Figure 13A:
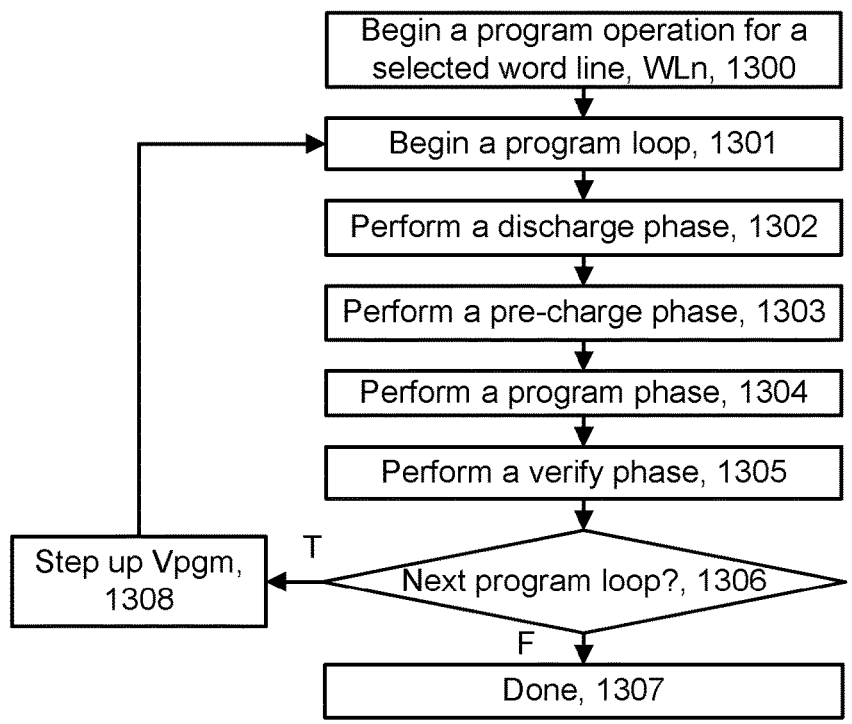
FIG. 13A depicts an example process for performing a program operation for a selected word line, where a program loop includes a discharge phase.

FIG. 13A depicts an example process for performing a program operation for a selected word line, where a program loop includes a discharge phase. The different steps 1301-1305 can be performed sequentially. Step 1300 begins a program operation for a selected word line, WLn. Step 1301 begins a program loop. Step 1302 involves performing a discharge phase 1489 (FIG. 14A-14D) of the program loop. Step 1303 involves performing a pre-charge phase 1490 of the program loop. Step 1304 involves performing a program phase 1491 of the program loop. Step 1305 involves performing a verify phase 1492 of the program loop.

A decision step 1306 determines if there is a next program loop. A next program loop may be performed if many memory cells have not completed programming or are otherwise not in the lockout state. If this is true, step 1308 includes stepping up Vpgm, and a next program loop begins at step 1301. If decision step 1306 is false, step 1307 denotes the end of the program operation. The program operation may be ended when all, or nearly all of the memory cells connected to WLn are in the lockout state.

In an example implementation, a method comprises performing a program loop for a selected word line, wherein the selected word line is connected to a NAND string, the NAND string comprises a channel, a drain-end, a source-end, and memory cells between the drain-end and the source-end. The performing the program loop comprises: performing a discharge operation which moves electrons from a source-side region of the channel, on a source-side of the selected word line, to a drain-side region of the channel, on a drain-side of the selected word line, the discharge operation is performed while floating a voltage of the drain-side region of the channel; after the performing of the discharge operation, performing a pre-charge operation by driving the drain-side region of the channel with a positive voltage at the drain-end; and after the performing of the pre-charge operation, applying a program pulse to the selected word line.

In one implementation, the floating of the voltage of the drain-side region of the channel comprises applying a turn-off voltage, e.g., 0 V, to a select gate transistor at the drain end of the NAND string.

In one implementation, the method may further include applying a turn-on voltage, e.g., 6 V, to a select gate transistor at the drain end of the NAND string during the pre-charge operation to allow the driving of the drain-side region of the channel with the positive voltage.

In one implementation, the performing the discharge operation comprises applying a voltage pulse to the selected word line and a first set of drain-side word lines 1220 adjacent to the selected word line on a drain-side of the selected word line while applying a fixed voltage, e.g., 0 V, which is lower than a level of the voltage pulse, e.g., 10 V, to a set of source-side word lines 1210 adjacent to the selected word line on a source-side of the selected word line.

In one implementation, the performing the discharge operation comprises applying a fixed voltage, e.g., 0 V, which is lower than a level of the voltage pulse, e.g., 10 V, to a second set of drain-side word lines 1230 adjacent to the first set of drain-side word lines.

Figure 13B:
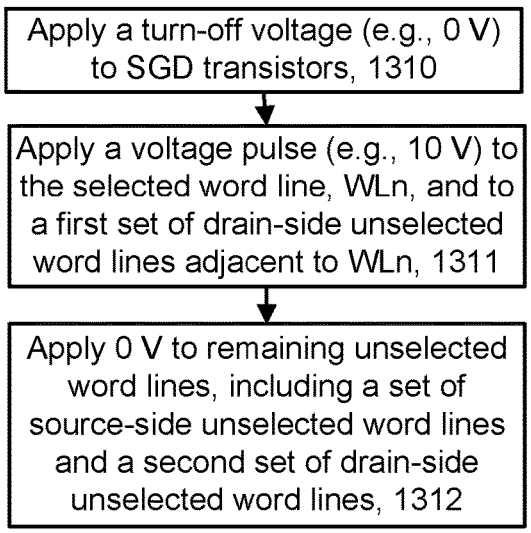
FIG. 13B depicts an example process for performing the discharge phase of step 1302 of FIG. 13A.

FIG. 13B depicts an example process for performing the discharge phase of step 1302 of FIG. 13A. The different steps can be performed concurrently. Step 1310 includes applying a turn-off voltage (e.g., 0 V) to the SGD transistors (plot 1421 in FIG. 14C). Step 1311 includes applying a voltage pulse (e.g., 10 V) to the selected word line, WLn (plot 1401 in FIG. 14A), and to a first set of drain-side unselected word lines adjacent to WLn (plot 1411 in FIG. 14B). Step 1312 includes applying 0 V to remaining unselected word lines (plot 1413 in FIG. 14B), including a set of source-side unselected word lines and a second set of drain-side unselected word lines. The level of the voltage pulse exceeds the level of the voltage applied to the remaining unselected word lines.

Figure 13C:
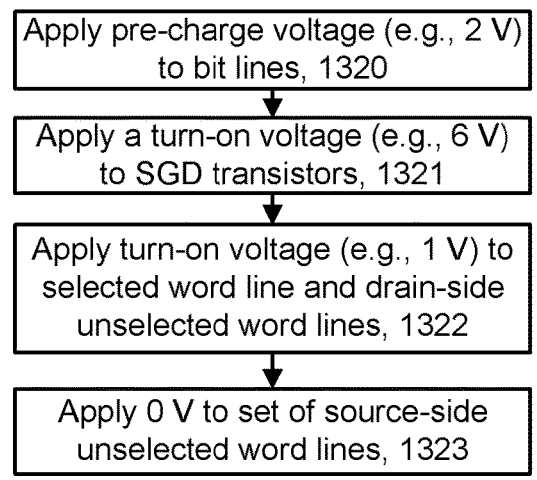
FIG. 13C depicts an example process for performing the pre-charge phase of step 1303 of FIG. 13A.

FIG. 13C depicts an example process for performing the pre-charge phase of step 1303 of FIG. 13A. The different steps can be performed concurrently. Step 1320 includes applying a pre-charge voltage (e.g., 2 V) to bit lines (plot 1432 in FIG. 14D). Step 1321 includes applying a turn-on voltage (e.g., 6 V) to SGD transistors (plot 1422 in FIG. 14C). Step 1322 includes applying a turn-on voltage (e.g., 1 V) to the selected word line and the drain-side unselected word lines (plot 1412 in FIG. 14B). A small positive voltage such as 1 V is typically high enough to provide the memory cells of the selected word line and the drain-side unselected word lines in a conductive state since these memory cells are in the erased state with a Vth=−1 V, for instance. This allows the bit line voltage to be passed in the drain-side channel region. Step 1323 includes applying 0 V to the set of source-side unselected word lines (plot 1413a in FIG. 14B). The memory cells of the source-side unselected word lines have been programmed so that their Vth will be as high as 5 V, for instance. The source side channel region will be non-conductive and is therefore not pre-charged.

Figure 13D:
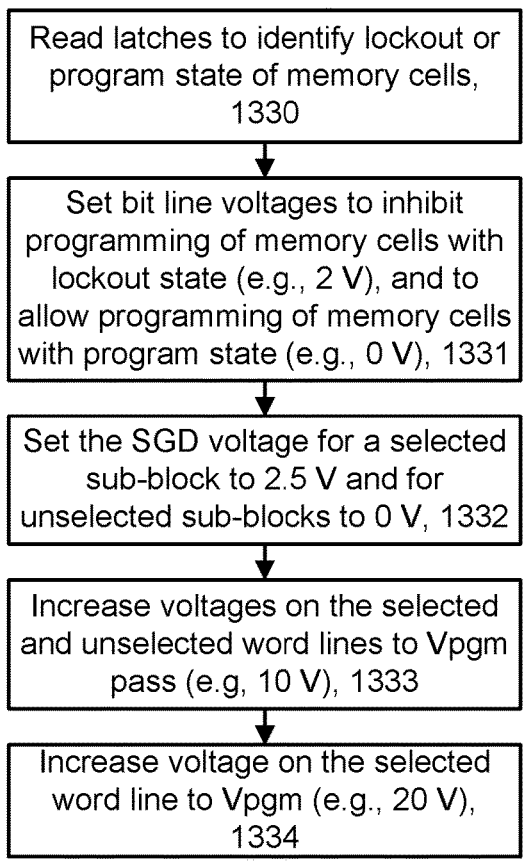
FIG. 13D depicts an example process for performing the program phase of step 1304 of FIG. 13A.

FIG. 13D depicts an example process for performing the program phase of step 1304 of FIG. 13A. Step 1330 includes reading the latches of the selected memory cells to identify the lockout or program state of the memory cells. Step 1331 includes setting the bit line voltages in a block to inhibit programming of memory cells with the lockout state, e.g., by setting Vbl_unsel=2 V (plot 1434 in FIG. 14D), and to allow programming of memory cells with the program state, e.g., by setting Vbl_sel=0 V (plot 1435 in FIG. 14D). Step 1332 includes setting the SGD voltage for a selected sub-block to 2.5 V (plot 1423 in FIG. 14C) and for unselected sub-blocks to 0 V (plot 1424 in FIG. 14C). Step 1333 includes increasing voltages on the selected and unselected word lines to Vpgm pass (e.g., 10 V) (plot 1403 in FIG. 14A and plot 1414 in FIG. 14B). Step 1334 includes increasing the voltage on the selected word line from Vpgm pass to Vpgm (plot 1404 in FIG. 14A) and maintaining Vpgm for a period of time (until t7). Generally, the voltage on the selected word line can be increased from the initial voltage to Vpgm in one or more steps. The voltage on the selected word line is then decreased to 0 V, for instance. Step 1330 may be performed before step 1331. Step 1331-1332 may be performed concurrently after which step 1334 may be performed.

Figure 13E:
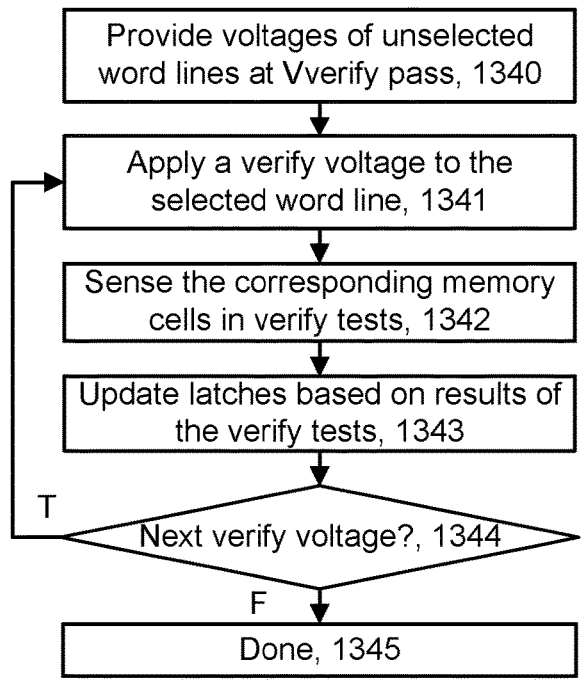
FIG. 13E depicts an example process for performing the verify phase of step 1305 of FIG. 13A.

FIG. 13E depicts an example process for performing the verify phase of step 1305 of FIG. 13A. Step 1340 includes providing voltages of unselected word lines at Vverify pass, e.g., 8-10 V (plot 1416 in FIG. 14B). Step 1341 includes applying a verify voltage to the elected word line (plot 1405 or 1406 in FIG. 14A). Step 1342 includes sensing the corresponding memory cells in a verify test. For instance, when VvA is applied to WLn, sensing occurs for the memory cells assigned to the A state. When VvB is applied to WLn, sensing occurs for the memory cells assigned to the B state. Step 1343 includes updating the latches based on the results of the verify tests. For example, the latches can be updated from the program state to the lockout state for memory cells which pass a verify test at step 1342. These are memory cells sensed to be in a non-conductive state, indicating that their Vth exceeds the verify voltage.

A decision step 1344 determines whether there is a next verify voltage to apply to WLn. If the decision step is true, step 1341 is reached. If the decision step is false, the process is done at step 1345.

FIG. 14A-14D depicts examples of voltage signals which can be used in a program loop of a program operation, consistent with FIG. 13A. The vertical dimension denotes voltage and the horizontal dimension denotes time, with time points t0-t10. The period of time depicted corresponds to one program loop and includes a discharge phase 1489 (t0 to just after t1), a pre-charge phase 1490 (t2-t3), a program phase 1491 (t4-t7) and a verify phase 1492 (t8-t10). Example voltages of the signals are also depicted. A voltage signal 1400 represents VWLn, the voltage of the selected word line, a voltage signal 1410 represents Vwl_unsel, a voltage of unselected word lines, a voltage signal 1420 represents the select gate voltages, e.g., Vsgd and/or Vsgs, and a voltage signal 1430 represents Vbl, a bit line voltage.

FIG. 14A depicts voltages applied to a selected word line. A plot 1401 represents an initial voltage such as 0 V, a plot 1401 represents the discharge voltage pulse at 10 V, for example, a plot 1402 represents a pre-charge level of 1 V, plots 1403 and 1404 represent Vpgm pass and Vpgm, respectively, in a program pulse, and plots 1405 and 1406 represent VvA and VvB, respectively.

FIG. 14B depicts voltages applied to unselected word lines. VWL_unsel is initially at 0 V, for example. A plot 1411 represents the word lines which receive the discharge voltage pulse. During the pulse, a plot 1413 represents 0 V on the remaining word lines which do not receive the discharge voltage pulse. In the pre-charge phase, a plot 1412 represents 1 V on the drain-side word lines, and a plot 1413a represents 0 V on the source-side word lines. The second set of drain-side word lines 1230 may follow the plot 1413 and then the plot 1412, while the set of source-side word lines 1210 may follow the plot 1413 and then the plot 1413a. The plot 1414 represents Vpgm pass applied to all of the unselected word lines, the plot 1415 represents the voltages of the unselected word lines returning to 0 V, and the plot 1416 represents Vverify pass applied to all of the unselected word lines.

FIG. 14C depicts voltages applied to select gate transistors. The selected select gate (SG) transistors are in a selected sub-block (a sub-block selected for programming), and the unselected SG transistors are in unselected sub-blocks (sub-block which are not selected for programming). A plot 1421 represents an initial voltage of 0 V. A plot 1422 represents 6 V, which provides the SG transistors in a conductive state. Subsequently, a plot 1423 with Vsg_sel=2.5 V represents the voltage of the selected SG transistors, and a plot 1424 with Vsg_unsel=0 V represents the voltage of the unselected SG transistors. A plot 1425 represents Vsg_sel=6 V in the verify phase.

FIG. 14D depicts voltages applied to bit lines. A plot 1431 depicts an initial voltage of 0 V. A plot 1432 depicts Vbl=2 V during the pre-charge phase for selected and unselected bit lines. The selected and unselected bit lines are connected to selected and unselected NAND strings, respectively, in a selected sub-block, in one approach. Subsequently, a plot 1433 depicts Vbl returning to 0 V. A plot 1434 depicts Vbl_unsel=2 V (a voltage on unselected bit lines), and a plot 1435 depicts Vbl_sel=0 V (a voltage on selected bit lines). Subsequently, a plot 1436 depicts Vbl_unsel returning to 0 V. In the verify phase, the voltage on the unselected bit lines can be 2 V (plot 1437) and the voltage on the selected bit lines can be 0.5 V (plot 1438), for example.

In the discharge phase, a voltage pulse is applied to cause source-side electrons to move to the drain-side of WLn.

In the pre-charge phase, a positive Vbl (plot 1432) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain-side channel. It is also possible for the SGS transistors of the selected and unselected sub-blocks to be in a conductive state at this time, with a voltage of 6 V, for example (plot 1422) to allow the source line voltage (Vsl) to be passed to the source end of the channel In the program phase, VWLn and VWL_unsel are ramped up, e.g., starting at t4, to provide a capacitive coupling up of the channels of the unselected NAND strings. VWLn is then ramped up further at t6 to the peak program pulse level of Vpgm and held at Vpgm until t7. After the program pulse, VWLn is ramped down to Vss (0 V). Subsequently, in the verify phase, one or more verify tests are performed by applying one or more control gate read voltages (plots 1405 and 1406) on WLn and, for each read voltage, sensing the conductive state of the memory cells in the selected NAND strings of the selected sub-block.

During the program phase, Vsg_sel can be set to, e.g., 2.5 V, for the selected sub-block (plot 1423) and Vsg_unsel can be set to, e.g., 0 V, for the unselected sub-blocks (plot 1424). With Vbl_sel=0 V (plot 1435), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1434 and 1437). Vbl_sel can be increased during the verify phase (plot 1438) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase, program phase and verify phase for the selected NAND strings. Vsg_unsel is at a reduced level such as 0 V which provides the SG_unsel transistors in a non-conductive state for the strings in the unselected sub-blocks. After the verify phase, Vbl is decreased to 0 V so that the SGD transistors are cutoff and the channel region has a floating voltage.

In FIG. 15A-15C, the vertical axis depicts the number of word lines in the set 1220 of FIG. 12A.

FIG. 15A depicts a plot of a number of word lines in a first set of drain-side word lines which receive a discharge voltage pulse in a discharge period, versus temperature, consistent with FIGS. 12A and 13A. The likelihood of the injection type of disturb increases as the temperature decreases, e.g., below a threshold temperature (Temp_th) of 25 C. At lower temperatures, electrons encounter fewer scattering events when flowing in the channel due to phonon scattering, which is proportional to temperature. Therefore, the electrons may keep a higher velocity and have a higher probability of being injected into the memory cells. Accordingly, as a countermeasure, the number of word lines in the first set of drain-side word lines can be increased when the temperature is below Temp_th to help prevent the channel voltage from being pulled down as depicted by the arrow 1251 in FIG. 12B. By preventing the channel voltage from being pulled down, the discharge of the residue electrons is more complete so that there is a lower likelihood of program disturb.

In one approach, there are N1 word lines in the first set of drain-side word lines (plot 1501) when Temp>Temp_th and N2 word lines in the first set of drain-side word lines (plot 1500) when Temp<=Temp_th. In another approach, the number of word lines in the first set of drain-side word lines increases as the temperature decreases below Temp_th (plot 1502) until a maximum level of N3 is reached. N3>N2>N1. For example, with 96 word lines, we might have N1=15, N2=20 and N3=25.

A plot 1503 depicts an option to set zero word lines in the first set of drain-side word lines, indicating that the discharge pulse is not used in the program operation or in a current program loop when Temp>Temp_th.

In an example implementation, an apparatus comprises a temperature-sensing circuit providing an indication of temperature, wherein a number of word lines in the first drain-side set of word lines 1220 is relatively large, e.g., N2 or N3, and a number of word lines in the second drain-side set of word lines is relatively small, when the temperature is relatively low, e.g., below Temp_th. Generally, the number of word lines NWL2 in the second drain-side set of word lines will be equal to the number of drain-side word lines NDSWL of WLn minus the number of word lines NWL1 in the first set of drain-side word lines. Thus, as NWL1 increases, NWL2 will decrease, for a given NDSWL.

In another example implementation, a number of word lines in the first set of drain-side word lines is greater when a temperature is below a threshold Temp_th than when the temperature is above the threshold.

FIG. 15B depicts a plot of a number of word lines in a first set of drain-side word lines which receive a discharge voltage pulse in a discharge period, versus Vpgm and program loop (PL) number, consistent with FIGS. 12A and 13A. The likelihood of program disturb increases as the PL number and the corresponding Vpgm magnitude increases, e.g., above a threshold program loop number (PL_th) or a threshold Vpgm (Vpgm_th), respectively. In particular, program disturb is more likely to occur when Vpgm is relatively high, since the electrons are attracted to the charge trapping regions of the WLn memory cells in proportion to the magnitude of the control gate voltage of WLn. Accordingly, the number of word lines in the first set of drain-side word lines can be increased when Vpgm>Vpgm_th or PL>PL_th. This helps prevent the channel voltage from being pulled down, as depicted by the arrow 1251 in FIG. 12B, and to ensure a more complete discharge of the source side electrons. In one approach, there are N1 word lines in the first set of drain-side word lines (plot 1510) when Vpgm<Vpgm_th or PL<PL_th and N2 word lines in the first set of drain-side word lines (plot 1511) when Vpgm>=Vpgm_th or PL>=PL_th. In another approach, the number of word lines in the first set of drain-side word lines increases as Vpgm or PL increases above Vpgm_th or PL_th, respectively (plot 1512) until a maximum level of N3 is reached.

A plot 1513 depicts an option to set zero word lines in the first set of drain-side word lines, indicating that the discharge pulse is not used in the program operation or in a current program loop, when Vpgm<Vpgm_th or PL<PL_th.

In an example implementation, a number of word lines in the first drain-side set of word lines is relatively large, e.g., N2 or N3, and a number of word lines in the second drain-side set of word lines is relatively small, when the selected program loop is relatively later, e.g., after PL_th, in the plurality of program loops.

In another example implementation, a number of word lines in the first drain-side set of word lines is relatively large, and a number of word lines in the second drain-side set of word lines is relatively smaller, when a magnitude of the program pulse is relatively large.

In another example implementation, a number of word lines in the first set of drain-side word lines is greater when a magnitude of the program pulse is above a threshold Vgm_th than when the magnitude of the program pulse is below the threshold.

FIG. 15C depicts a plot of a number of word lines in a first set of drain-side word lines which receive a discharge voltage pulse in a discharge period, versus WLn position, consistent with FIGS. 12A and 13A. The likelihood of program disturb increases as WLn is closer to the drain side of the block, due to the reduced number of word lines which can be boosted. Accordingly, the number of word lines in the first set of drain-side word lines can be increased when WLn>a threshold WL position (WL_th) such as WL48, which is half way between the drain end and source end of the block. Plot 1520 indicates that N1=15 word lines can be used in the first set of drain-side word lines when WLn<WL48 and plot 1522 indicates that N2=20 word lines can be used when WL76>WLn>=WL48. As WLn approaches the last WL, WL95, the number of drain-side word lines decreases. For example, a plot 1523 indicates that the number of drain side word lines decreases from 20 to 0 as WLn increases from WL76 to WL95.

A plot 1521 depicts an option to set zero word lines in the first set of drain-side word lines, indicating that the discharge pulse is not used in the program operation or in a current program loop when WLn<WL48.

In an example implementation, a number of word lines in the first drain-side set of word lines is relatively large, e.g., N2 or N3, and a number of word lines in the second drain-side set of word lines is relatively smaller, when the selected word line is relatively closer to the drain-ends of the NAND strings.

In one implementation, an apparatus comprises: a NAND string comprising a channel, a drain-end, a source-end, and memory cells between the drain-end and the source-end; a set of word lines connected to the NAND string, the set of word lines comprise a selected word line, a first set of drain-side word lines adjacent to the selected word line on a drain-side of the selected word line and a set of source-side word lines adjacent to the selected word line on a source-side of the selected word line; and a control circuit configured to perform a first plurality of program loops in a program operation for a until a threshold number of program loops is reached, and when the threshold number of program loops is reached, perform a second plurality of program loops in the program operation. The second plurality of program loops each include a discharge phase in which a voltage pulse is applied to the selected word line and the first set of drain-side word lines but not to the set of source-side word lines, and a pre-charge phase which follows the discharge phase and a program phase which follows the pre-charge phase; and the first plurality of program loops do not include the discharge phase.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of memory cells arranged in NAND strings, each NAND string has a drain-end and a source end, and a select gate transistor at the drain-end;
   bit lines connected to the drain-end of each NAND string;
   a selected word line and unselected word lines connected to the set of memory cells, the unselected word lines comprising a first drain-side set of word lines adjacent to the selected word line on a drain-side of the selected word line, and a set of source-side word lines adjacent to the selected word line on a source-side of the selected word line; and
   a control circuit, the control circuit, to perform a selected program loop for the selected word line in a plurality of program loops of a program operation, is configured to:
      in a discharge period, apply a voltage pulse to the selected word line and the first drain-side set of word lines while holding a voltage of the set of source-side word lines at a level which is lower than a level of the voltage pulse and while applying a turn-off voltage to the select gate transistor of each of the NAND strings;

in a pre-charge period which is after the discharge period, apply a turn-on voltage to the select gate transistor of each of the NAND strings and a positive voltage to the bit lines; and in a program period which is after the pre-charge period, apply a program pulse to the selected word line while applying a pass voltage to the unselected word lines.

2. The apparatus of claim 1, wherein:
the unselected word lines comprises a second drain-side set of word lines adjacent to the first drain-side set of word lines; and
the control circuit is configured to, in the discharge period, hold a voltage of the second drain-side set of word lines at a level which is lower than the level of the voltage pulse.

3. The apparatus of claim 2, wherein:
the voltage of the second drain-side set of word lines is equal to the voltage of the set of source-side word lines in the discharge period.

4. The apparatus of claim 2, further comprising:
a temperature-sensing circuit providing an indication of temperature, wherein a number of word lines in the first drain-side set of word lines is relatively large when the temperature is relatively low.

5. The apparatus of claim 2, wherein:
a number of word lines in the first drain-side set of word lines is relatively large, and a number of word lines in the second drain-side set of word lines is relatively small, when the selected program loop is relatively later in the plurality of program loops.

6. The apparatus of claim 2, wherein:
a number of word lines in the first drain-side set of word lines is relatively large, and a number of word lines in the second drain-side set of word lines is relatively smaller, when a magnitude of the program pulse is relatively large.

7. The apparatus of claim 2, wherein:
a number of word lines in the first drain-side set of word lines is relatively large, and a number of word lines in the second drain-side set of word lines is relatively smaller, when the selected word line is relatively close to the drain-ends of the NAND strings.

8. The apparatus of claim 1, wherein:
the voltage of the set of source-side word lines is held at ground in the discharge period.

9. The apparatus of claim 1, wherein:
the level of the voltage of the pulse exceeds the level of the voltage of the set of source-side word lines by at least 5 V.

10. The apparatus of claim 1, wherein:
the first drain-side set of word lines comprises at least 10% of the unselected word lines.

11. A method, comprising:
performing a program loop for a selected word line, wherein the selected word line is connected to a NAND string, the NAND string comprises a channel, a drain-end, a source-end, and memory cells between the drain-end and the source-end, the performing the program loop comprises:
performing a discharge operation which moves electrons from a source-side region of the channel, on a source-side of the selected word line, to a drain-side region of the channel, on a drain-side of the selected word line, the discharge operation is performed while floating a voltage of the drain-side region of the channel;

after the performing of the discharge operation, performing a pre-charge operation by driving the drain-side region of the channel with a positive voltage at the drain-end; and after the performing of the pre-charge operation, applying a program pulse to the selected word line.

12. The method of claim 11, wherein:
the floating of the voltage of the drain-side region of the channel comprises applying a turn-off voltage to a select gate transistor at the drain end of the NAND string.

13. The method of claim 11, further comprising:
applying a turn-on voltage to a select gate transistor at the drain end of the NAND string during the pre-charge operation to allow the driving of the drain-side region of the channel with the positive voltage.

14. The method of claim 11, wherein:
the performing the discharge operation comprises applying a voltage pulse to the selected word line and a first set of drain-side word lines adjacent to the selected word line on a drain-side of the selected word line while applying a fixed voltage which is lower than a level of the voltage pulse to a set of source-side word lines adjacent to the selected word line on a source-side of the selected word line.

15. The method of claim 14, wherein:
the performing the discharge operation comprises applying a fixed voltage which is lower than a level of the voltage pulse to a second set of drain-side word lines adjacent to the first set of drain-side word lines.

16. The method of claim 14, wherein:
a number of word lines in the first set of drain-side word lines is greater when a temperature is below a threshold than when the temperature is above the threshold.

17. The method of claim 14, wherein:
a number of word lines in the first set of drain-side word lines is greater when a magnitude of the program pulse is above a threshold than when the magnitude of the program pulse is below the threshold.

18. An apparatus, comprising:
a NAND string comprising a channel, a drain-end, a source-end, and memory cells between the drain-end and the source-end;

a set of word lines connected to the NAND string, the set of word lines comprise a selected word line, a first set of drain-side word lines adjacent to the selected word line on a drain-side of the selected word line and a set of source-side word lines adjacent to the selected word line on a source-side of the selected word line; and a control circuit configured to perform a first plurality of program loops in a program operation for a until a threshold number of program loops is reached, and when the threshold number of program loops is reached, perform a second plurality of program loops in the program operation; wherein:
the second plurality of program loops each include a discharge phase in which a voltage pulse is applied to the selected word line and the first set of drain-side word lines but not to the set of source-side word lines, and a pre-charge phase which follows the discharge phase and a program phase which follows the pre-charge phase; and
the first plurality of program loops do not include the discharge phase.

19. The apparatus of claim 18, wherein:
in the discharge phase, a ground voltage is applied to the set of source-side word lines.

20. The apparatus of claim 18, wherein:
in the discharge phase, a ground voltage is applied to a second set of drain-side word lines adjacent to the first set of drain-side word lines.

* * * * *